United States Patent
Dono et al.

(10) Patent No.: US 9,030,233 B2
(45) Date of Patent: May 12, 2015

(54) SEMICONDUCTOR DEVICE HAVING SERIALIZER CONVERTING PARALLEL DATA INTO SERIAL DATA TO OUTPUT SERIAL DATA FROM OUTPUT BUFFER CIRCUIT

(75) Inventors: Chiaki Dono, Tokyo (JP); Shinya Miyazaki, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 224 days.

(21) Appl. No.: 13/618,985

(22) Filed: Sep. 14, 2012

(65) Prior Publication Data

US 2013/0082737 A1    Apr. 4, 2013

(30) Foreign Application Priority Data

Sep. 29, 2011   (JP) .................................. 2011-213700

(51) Int. Cl.
*H03K 19/094* (2006.01)
*H03B 1/00* (2006.01)
*G11C 7/10* (2006.01)
*H03K 19/0185* (2006.01)
*G11C 11/4096* (2006.01)

(52) U.S. Cl.
CPC ........ *G11C 7/106* (2013.01); *H03K 19/018571* (2013.01); *G11C 11/4096* (2013.01); *G11C 2207/107* (2013.01)

(58) Field of Classification Search
None
See application file for complete search history.

(56) References Cited

U.S. PATENT DOCUMENTS

| | | | |
|---|---|---|---|
| 7,215,128 B2 | 5/2007 | Fujisawa | |
| 7,495,453 B2 | 2/2009 | Fujisawa | |
| 7,808,270 B2 | 10/2010 | Fujisawa | |
| 8,198,911 B2 | 6/2012 | Fujisawa | |
| 2006/0158198 A1 | 7/2006 | Fujisawa | |
| 2007/0194798 A1 | 8/2007 | Fujisawa | |
| 2009/0146756 A1 | 6/2009 | Fujisawa | |
| 2011/0001511 A1* | 1/2011 | Fujisawa | 326/30 |
| 2011/0273431 A1* | 11/2011 | Ando et al. | 345/212 |
| 2012/0217992 A1 | 8/2012 | Fujisawa | |
| 2013/0002300 A1* | 1/2013 | Fiedler | 326/83 |

FOREIGN PATENT DOCUMENTS

| | | |
|---|---|---|
| JP | 5-250066 A | 9/1993 |
| JP | 2006-203405 A | 8/2006 |

* cited by examiner

*Primary Examiner* — Jany Richardson

(57) ABSTRACT

Disclosed herein is a device that includes first and second buffer circuits connected to a data terminal and a first control circuit controlling the first and second buffer circuits. The first control circuit receives n pairs of first and second internal data signals complementary to each other from 2n input signal lines and outputs a pair of third and fourth internal data signals complementary to each other to first and second output signal lines, where n is a natural number more than one. The first and second buffer circuits are controlled based on the third and fourth internal data signals such that one of the first and second buffer circuits turns on and the other of the first and second buffer circuits turns off.

16 Claims, 19 Drawing Sheets

| IODT | DRV | OUTPUT |
|---|---|---|
| "L" | "L" | ODTC |
|  | "H" | RONC |
| "H" | "L" | All "L" |
|  | "H" | RONC |

SEMICONDUCTOR DEVICE HAVING SERIALIZER CONVERTING PARALLEL DATA INTO SERIAL DATA TO OUTPUT SERIAL DATA FROM OUTPUT BUFFER CIRCUIT

BACKGROUND OF THE INVENTION

1. Field of the Invention

The present invention relates to semiconductor devices and, in particular, relates to a semiconductor device including a serializer.

2. Description of Related Art

In semiconductor devices such as DRAM (Dynamic Random Access Memory), an output buffer circuit is provided for outputting a data signal to the outside of the semiconductor device. Some of versatile semiconductor devices, in particular, are configured to be able to select impedance of the output buffer circuit (See Japanese Patent Application Laid-open No. 2006-203405).

As disclosed in Japanese Patent Application Laid-open No. 2006-203405, the output buffer circuit has the structure in which a pull-up buffer circuit consisting of p-channel MOS transistors and a pull-down buffer circuit consisting of n-channel MOS transistors are connected in series. A data terminal is connected to a contact node between the pull-up buffer circuit and the pull-down buffer circuit. When a high-level data signal is outputted from the data terminal, it is controlled in such a manner that the pull-up buffer circuit is turned on and the pull-down buffer circuit is turned off. On the other hand, when a low-level data signal is outputted from the data terminal, it is controlled in such a manner that the pull-up buffer circuit is turned off and the pull-down buffer circuit is turned on.

In many cases, data composed of a plurality of bits are read out from memory cells of the DRAM in parallel, and parallel/serial conversion is performed by a serializer (refer to Japanese Patent Application Laid-open No. H5-23006). The output buffer circuit is controlled by the serialized data signals.

During a period when the data signal is not outputted from the data terminal, however, it is necessary to allow the output buffer circuit to be in a high impedance state or to function as a termination resistor having predetermined impedance. The function of the output buffer circuit as the termination resistor is referred to as ODT (On Die Termination).

In order to allow the output buffer circuit to be in the high impedance state, it is necessary to turn off both of the pull-up buffer circuit and the pull-down buffer circuit. With DDR3 (Double Data Rate 3) SDRAM (Synchronous DRAM), both of the pull-up buffer circuit and the pull-down buffer circuit need to be turned on when the output buffer circuit performs ODT operation. Thus, it is necessary for the DDR3 SDRAM to deal with four cases in total, that is, the case where only the pull-up buffer circuit is turned on, the case where only the pull-down buffer circuit is turned on, the case where both of the buffer circuits are turned on, and the case where both of the buffer circuit are turned off. Therefore, operation of the pull-up buffer circuit and operation of the pull-down buffer circuit need to be controllable separately.

To realize the above-described four cases in the pull-up buffer circuit and the pull-down buffer circuit, it is necessary to supply two-bit signals (two types of signals) to the output buffer circuit. When outputting the two-bit data from the serializer, however, an output load of the serializer increases. Especially, when high-speed operation of the DRAM is performed, deterioration in signal quality, caused by the output load of the serializer, becomes unignorable.

SUMMARY

In one embodiment, there is provided a semiconductor memory device that includes: a data terminal; a first power supply line supplying a first potential; a second power supply line supplying a second potential different from the first potential; a first buffer circuit coupled between a first power supply line and the data terminal; a second buffer circuit coupled between a second power supply line and the data terminal; and a first control circuit receiving n pairs of first and second internal data signals complementary to each other from 2n input signal lines, and outputting a pair of third and fourth internal data signals complementary to each other to first and second output signal lines, where n is a natural number more than one. The first and second buffer circuits are controlled based on the third and fourth internal data signals such that one of the first and second buffer circuits turns on and the other of the first and second buffer circuits turns off.

In another embodiment, there is provided a semiconductor memory device that includes: a data terminal; a first power supply line supplying a first potential; a second power supply line supplying a second potential different from the first potential; a first buffer circuit coupled between a first power supply line and the data terminal, the first buffer circuit being activated when a first signal is in a first logic level, and deactivated when the first signal is in a second logic level; a second buffer circuit coupled between a second power supply line and the data terminal, the second buffer circuit being activated when a second signal is in the second logic level, and deactivated when the second signal is in the first logic level, the first and second signals being complementary to each other; a first output selection circuit including first and second transistors connected in series and third and fourth transistors connected in series, the first signal being outputted from between the first and second transistors, the second signal being outputted from between the third and fourth transistors, the first and fourth transistor being controlled based on a first relay signal, and the second and third transistor being controlled based on a second relay signal; and a first logic circuit activating the first relay signal when at least one of a plurality of third signals is in the one of the first and second logic levels and when a first enable signal is activated, and activating the second relay signal when at least one of a plurality of fourth signals is in the one of the first and second logic levels and when a second enable signal is activated, the third signals and the fourth signals constituting a plurality of pair of third and fourth signals complementary to each other.

DETAILED DESCRIPTION OF THE EMBODIMENTS

Preferred embodiments of the present invention will be explained below in detail with reference to the accompanying drawings.

Figure 1:
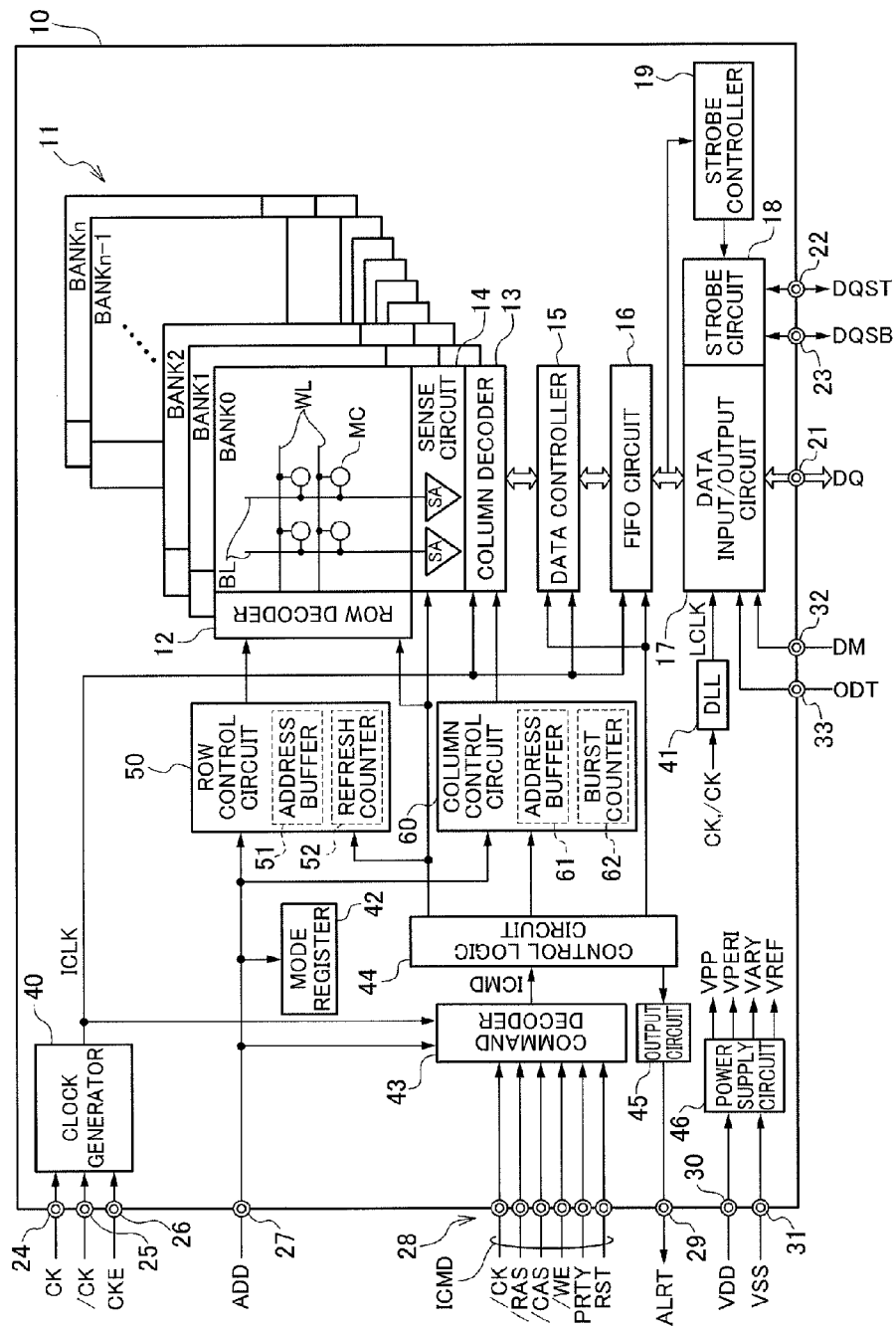
FIG. 1 is a block diagram showing the entire structure of a semiconductor device according to an embodiment of the present invention.

Turning to FIG. 1, the semiconductor device 10 according to this embodiment is DRAM integrated on single semiconductor chip, and includes a memory cell array 11 that is divided into n+1 banks. The bank is a unit capable of executing a command independently, and basically, non-exclusive operation is possible between the banks.

The memory cell array 11 is provided with a plurality of word lines WL and a plurality of bit lines BL that are intersecting each other, and memory cells MC are arranged at points of the intersection. The word line WL is selected by a row decoder 12 and the bit line BL is selected by a column decoder 13. The bit lines BL are respectively connected to corresponding sense amplifiers SA in a sense circuit 14, and the bit line BL that is selected by the column decoder 13 is connected to a data controller 15 via the sense amplifier SA. The data controller 15 is connected to a data input/output circuit 17 via a FIFO circuit 16. The data input/output circuit 17 is a circuit block for inputting/outputting data via a data terminal 21.

The semiconductor device 10 has further external terminals such as strobe terminals 22 and 23, clock terminals 24 and 25, a clock enable terminal 26, an address terminal 27, command terminals 28, an alert terminal 29, power supply terminals 30 and 31, a data mask terminal 32, an ODT terminal 33 and the like.

The strobe terminals 22 and 23 are terminals for inputting/outputting strobe signals DQST and DQSB, respectively. The strobe signals DQST and DQSB are complementary to each other, and define input/output timing of the data to be inputted/outputted via the data terminal 21. Specifically, the strobe signals DQST and DQSB are supplied to a strobe circuit 18 when the data is inputted, that is, during write operation, and based on these signals, the strobe circuit 18 controls operation timing of the data input/output circuit 17. Write data that is inputted via the data terminal 21 is thus received into the data input/output circuit 17 in synchronism with the strobe signals DQST and DQSB. On the other hand, when the data is outputted, that is, during read operation, a strobe controller 19 controls operation of the strobe circuit 18. Read data is thus outputted from the data input/output circuit 17 in synchronism with the strobe signals DQST and DQSB.

The clock terminals 24 and 25 are supplied with external clock signals CK and /CK, respectively. The external clock signals CK and /CK are transferred to a clock generator 40. The signal having "/" before the signal name herein means that the signal is a low active signal or an inverted signal of the corresponding signal. Therefore, the external clock signals CK and /CK are complementary to each other. The clock generator 40 is activated based on a clock enable signal CKE that is supplied via the clock enable terminal 26, to generate an internal clock signal ICLK. The external clock signals CK and /CK that are supplied via the clock terminals 24 and 25 are also supplied to a DLL circuit 41. The DLL circuit 41 is a circuit to generate an output clock signal LCLK that is phase-controlled based on the external clock signals CK and /CK. The output clock signal LCLK is used as a timing signal defining output timing of the read data DQ from the data input/output circuit 17.

The address terminal 27 is supplied with an address signal ADD. The address signal ADD supplied to the address terminal 27 is transferred to a row control circuit 50, a column control circuit 60, a mode register 42, a command decoder 43 and the like. The row control circuit 50 includes an address buffer 51, a refresh counter 52 and the like, and controls the row decoder 12 based on the row address. Further, the column control circuit 60 includes an address buffer 61, a burst counter 62 and the like, and controls the column decoder 13 based on the column address. When a mode register set command is issued, the address signal ADD is supplied to the mode register 42 so as to update the contents of the mode register 42. Impedance codes RONC, ODTC, as will be described later, and the like are also set in the mode register 42.

The command terminals 28 are supplied with a chip select signal /CS, a row address strobe signal /RAS, a column address strobe signal /CAS, a write enable signal /WE, a parity signal PRTY, a reset signal RST and the like. These command signals CMD are transferred to the command decoder 43 and, based on these command signals CMD, the command decoder 43 generates an internal command signal ICMD. The internal command signal ICMD is supplied to a control logic circuit 44. Based on the internal command signal ICMD, the control logic circuit 44 controls operation of the row control circuit 50, the column control circuit 60 and the like.

The command decoder 43 includes a not-shown verification circuit. The verification circuit verifies the address signal ADD and the command signal CMD based on the parity signal PRTY and, if an error is found in the address signal ADD or the command signal CMD as a result of the verification, outputs an alert signal ALRT via the control logic circuit 44 and an output circuit 45. The alert signal ALRT is outputted to the outside via the alert terminal 29.

The power supply terminals 30 and 31 are supplied with power supply potentials VDD and VSS, respectively. The power supply potentials VDD and VSS are supplied to a power supply circuit 46. The power supply circuit 46 is a circuit block to generate various internal potentials based on the power supply potentials VDD and VSS. The internal potentials generated by the power supply circuit 46 include a boosting potential VPP, a power supply potential VPERI, an array potential VARY, a reference potential VREF and the like. The boosting potential VPP is generated by boosting the power supply potential VDD, and the power supply potential VPERI, the array potential VARY and the reference potential VREF are generated by stepping down the power supply potential VDD.

The boosting potential VPP is mainly used in the row decoder 12. The row decoder 12 drives the word line WL, selected based on the address signal ADD, to the VPP level, to thereby allow a cell transistor included in the memory cell MC to conduct. The array potential VARY is mainly used in the sense circuit 14. When the sense circuit 14 is activated, one of a bit line pair is driven to the VARY level and the other is driven to the VSS level, so as to amplify the read data that is read out from the selected memory cell MC. The power supply potential VPERI is used to most peripheral circuits including the row control circuit 50, the column control circuit 60 and the like. As the power supply potential VPERI, whose voltage is lower than that of the power supply potential VDD, is used to these peripheral circuits, it is possible to reduce power consumption of the semiconductor device 10. Further, the reference potential VREF is a potential used in the data input/output circuit 17.

The data mask terminal 32 and the ODT terminal 33 are supplied with a data mask signal DM and a termination signal ODT, respectively. The data mask signal DM and the termination signal ODT are supplied to the data input/output circuit 17. The data mask signal DM is activated when masking a part of the write data and the read data, and the termination signal ODT is activated when using an output buffer included in the data input/output circuit 17 as a termination resistor.

The entire structure of the semiconductor device 10 according to this embodiment has been described thus far. Focusing on the data input/output circuit 17, the semiconductor device 10 of this embodiment will be explained in more detail as below.

Figure 2:
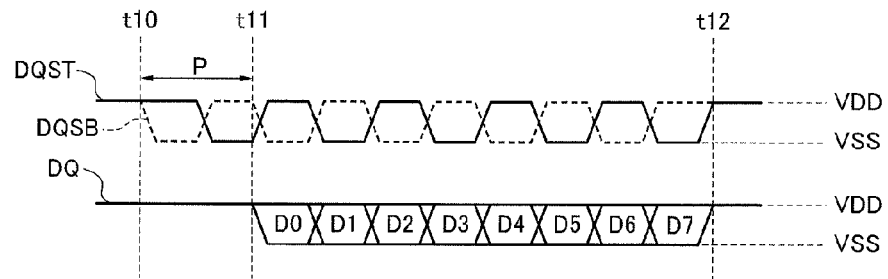
FIG. 2 is a timing chart showing waveforms of a read data and strobe signals during a read operation.

Turning to FIG. 2, a burst length is eight bits and the read data DQ is outputted serially during a period from a time t11 to a time t12. Here, the burst length means the number of bits of the data DQ outputted (or inputted) serially based on one column access. This basically corresponds to the number of the so-called pre-fetches, and is eight bits in DDR4 (Double Data Rate 4) SDRAM (Synchronous DRAM).

As shown in FIG. 2, the level of the data terminal 21 to output the read data DQ is fixed to the VDD level before the time t11. Similarly, the levels of the strobe terminals 22 and 23 to be output the strobe signals DQST and DQSB are also fixed to the VDD level. Clocking of the strobe signals DQST and DQSB is started from a time t10 that is earlier than the time t11 when burst output is started. The clocking of the strobe signals DQST and DQSB means the state in which the strobe signals DQST and DQSB become signals complementary to each other, one being the VDD level and the other being the VSS level, and the signal levels are inverted for every ½ clock cycle. A period P from the time t10 to the time 11 corresponds to a preamble period before executing the burst output of the read data DQ. According to the present embodiment, the time t10 when the clocking of the strobe signals DQST and DQSB is started may be referred to as "preparation timing", and the time t11 when the burst output is started may be referred to as "start timing".

At the time t11, the read data DQ is subjected to the burst output in synchronism with the clocking of the strobe signals DQST and DQSB. In FIG. 2, eight bits consisting of D0 to D7 are subjected to the burst output in this order. When the burst output is completed at the time t12, the levels of the terminals 21 to 23 return to the VDD level.

Thus, according to this embodiment, the level of the data terminal 21 is fixed to the VDD level except for the period when the read data DQ is subjected to the burst output (time t11 to time t12). Especially, when the termination signal ODT is activated before the time t10, the data terminal 21 is driven to the VDD level at a predetermined impedance. When the termination signal ODT is not activated before the time t10, on the other hand, the data terminal 21 is made to be in a high impedance state. Then the level of the data terminal 21 is driven to the VDD level by a device other than the semiconductor device 10. Although the ODT operation is not necessary during the period from the time t10 to the time t11, it is necessary that the data terminal 21 has the VDD level.

Figure 3:
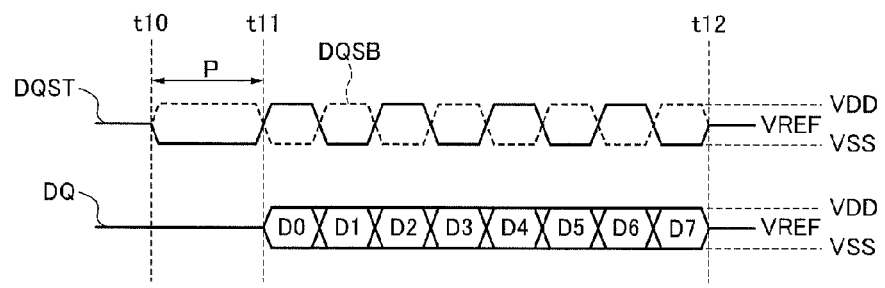
FIG. 3 is a timing chart showing waveforms that the inventors have conceived as a prototype in the course of making the present invention.

Turning to FIG. 3, that shows waveforms of the prototype, the level of the data terminal 21 is fixed to the VREF level before the time t11. The VREF level is an intermediate level between the VDD level and the VSS level, which can be defined as follows:

$$VREF=(VDD+VSS)/2$$

Similarly, the strobe signals DQST and DQSB are also fixed to the VREF level before the time t10. The clocking of the strobe signals DQST and DQSB is performed during the period from the time t10 to the time t12.

Figure 4:
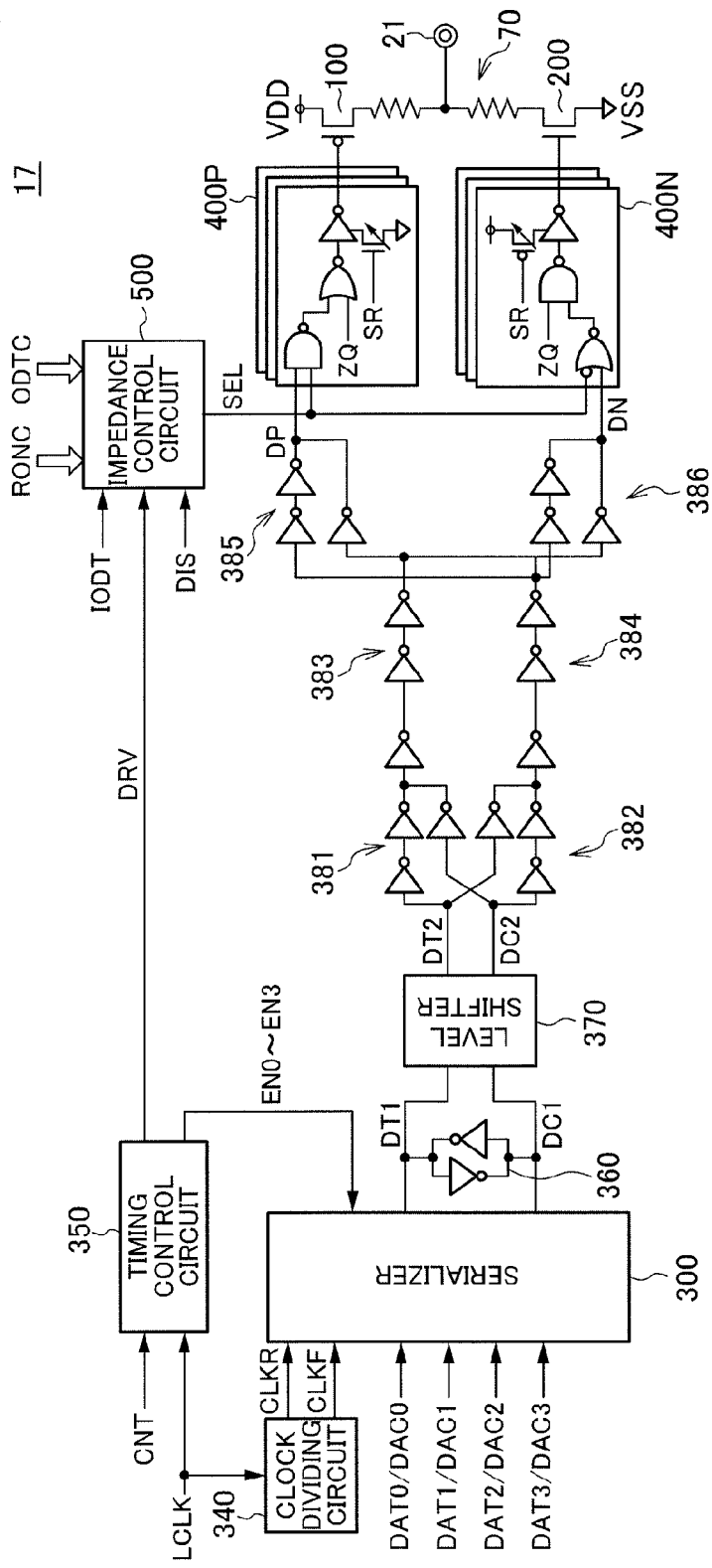
FIG. 4 is a circuit diagram showing an essential part of the data input/output circuit shown in FIG. 1.

As shown in FIG. 4, the data input/output circuit 17 includes an output buffer circuit 70 having a pull-up buffer circuit 100 and a pull-down buffer circuit 200. The pull-up buffer circuit 100 is connected between a power supply line supplying the power supply potential VDD and the data terminal 21, and the pull-down buffer circuit 200 is connected between a power supply line supplying the ground potential VSS and the data terminal 21. In FIG. 4, the pull-up buffer circuit 100 is illustrated by a symbol of one p-channel MOS transistor, but in actuality, it has a plurality of p-channel MOS transistors connected in parallel. Similarly, in FIG. 4, the pull-down buffer circuit 200 is illustrated by a symbol of one n-channel MOS transistor, but in actuality, it has a plurality of n-channel MOS transistors connected in parallel. Detailed circuit structures of the pull-up buffer circuit 100 and the pull-down buffer circuit 200 will be described later.

The power supply line supplying the power supply potential VDD is referred to as a "first power supply line" and the power supply line supplying the ground potential VSS is referred to as a "second power supply line". The pull-up buffer circuit 100 is referred to as a "first buffer circuit" and the pull-down buffer circuit 200 is referred to as a "second buffer circuit".

The data input/output circuit 17 is provided with a serializer 300 that performs on-off control of the pull-up buffer circuit 100 and the pull-down buffer circuit 200. The serializer 300 converts internal data signals DAT0/DAC0 to DAT3/DAC3 that are supplied in parallel and are complementary to each other into serial complementary data DT1/DC1. The internal data signals DAT0/DAC0 to DAT3/DAC3 are the internal read data read out from the memory cell array 11, and are supplied to the serializer 300 via the data controller 15 and the FIFO circuit 16. The serializer 300 may be referred to as a "first control circuit".

Figure 5:
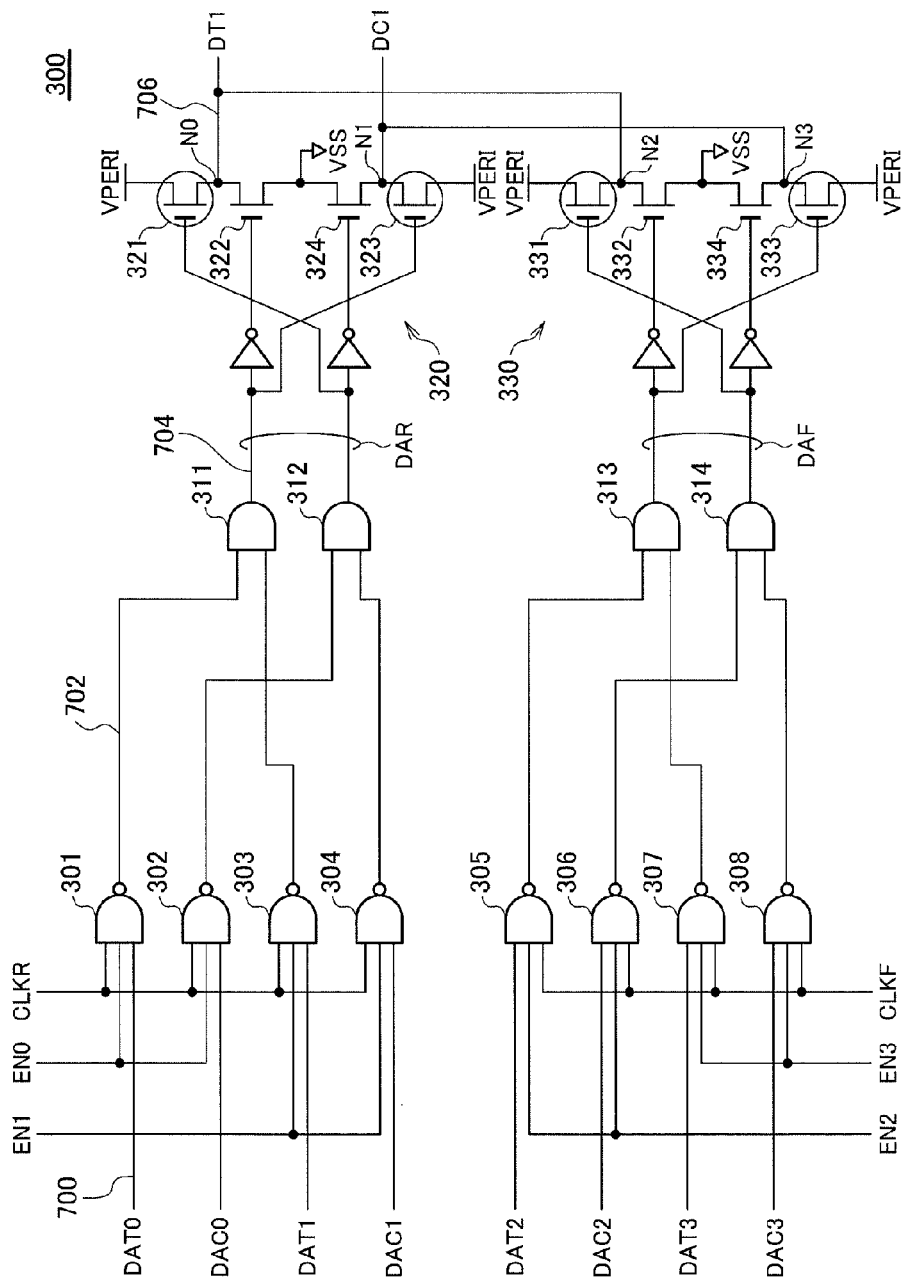
FIG. 5 is a circuit diagram of the serializer shown in FIG. 4.

Turning to FIG. 5, the serializer 300 includes three-input NAND gate circuits 301 to 308, two-input AND gate circuits 311 to 314, and tri-state buffer circuits 320 and 330. The corresponding internal data signals DAT0/DAC0 to DAT3/DAC3 are respectively supplied to first input nodes of the NAND gate circuits 301 to 308. A rising clock signal CLKR is supplied to second input nodes of the NAND gate circuits 301 to 304, and a falling clock signal CLKF is supplied to second input nodes of the NAND gate circuits 305 to 308. Further, an enable signal EN0 is supplied to third input nodes of the NAND gate circuits 301 and 302, an enable signal EN1 to third input nodes of the NAND gate circuits 303 and 304, an enable signal EN2 to third input nodes of the NAND gate circuits 305 and 306, and an enable signal EN3 to third input nodes of the NAND gate circuits 307 and 308.

The rising clock signal CLKR and the falling clock signal CLKF are complementary to each other, and generated by a clock dividing circuit 340 shown in FIG. 4. The clock dividing circuit 340 generates the rising clock signal CLKR and the falling clock signal CLKF that are complementary to each other based on the output clock signal LCLK generated by the DLL circuit 41.

The enable signals EN0 to EN3 are generated by a timing control circuit 350 shown in FIG. 4. The timing control circuit 350 is a circuit block that generates various signals in synchronism with the output clock signal LCLK based on a control signal CNT. The signals generated by the timing control circuit 350 include a drive signal DRV, other than the enable signals EN0 to EN3. At least the enable signal EN0 and the enable signal EN1 are not activated simultaneously, and the enable signal EN2 and the enable signal EN3 are not activated simultaneously. Accordingly, only one output signal of the NAND gate circuits 301 to 308 becomes the low level, and all of the remaining seven output signals become the high level.

The output signals of the NAND gate circuits 301 to 308 are supplied to corresponding input nodes of the AND gate circuits 311 to 314. Specifically, the output signals of the NAND gate circuits 301 and 303 are supplied to the AND gate circuit 311, the output signals of the NAND gate circuits 302 and 304 to the AND gate circuit 312, the output signals of the NAND gate circuits 305 and 307 to the AND gate circuit 313, and the output signals of the NAND gate circuits 306 and 308 to the AND gate circuit 314. Thereby, only one output signal of the AND gate circuits 311 to 314 becomes the low level, and all of the remaining three output signals become the high level.

Output signals DAR of the AND gate circuits 311 and 312 are supplied to the tri-state buffer circuit 320, and output signals DAF of the AND gate circuits 313 and 314 are supplied to the tri-state buffer circuit 330.

The tri-state buffer circuit 320 includes a p-channel MOS transistor 321 and an n-channel MOS transistor 322 that are connected in series between the power supply potential VPERI and the ground potential VSS, and a p-channel MOS transistor 323 and an n-channel MOS transistor 324 that are connected in series between the power supply potential VPERI and the ground potential VSS. The output signal of the AND gate circuit 312 is supplied to a gate electrode of the transistor 321, an inverted signal of the output signal of the AND gate circuit 311 is supplied to a gate electrode of the transistor 322, the output signal of the AND gate circuit 311 is supplied to a gate electrode of the transistor 323, and an inverted signal of the output signal of the AND gate circuit 312 is supplied to a gate electrode of the transistor 324. The signal DT1 as one of the complementary data is outputted from a node NO that is a contact node between the transistors 321 and 322, and the signal DC1 as the other of the complementary data is outputted from a node N1 that is a contact node between the transistors 323 and 324.

The tri-state buffer circuit 330 includes a p-channel MOS transistor 331 and an n-channel MOS transistor 332 that are connected in series between the power supply potential VPERI and the ground potential VSS, and a p-channel MOS transistor 333 and an n-channel MOS transistor 334 that are connected in series between the power supply potential VPERI and the ground potential VSS. The output signal of the AND gate circuit 314 is supplied to a gate electrode of the transistor 331, an inverted signal of the output signal of the AND gate circuit 313 is supplied to a gate electrode of the transistor 332, the output signal of the AND gate circuit 313 is supplied to a gate electrode of the transistor 333, and an inverted signal of the output signal of the AND gate circuit 314 is supplied to a gate electrode of the transistor 334. The signal DT1 as one of the complementary data is outputted from a node N2 that is a contact node between the transistors 331 and 332, and the signal DC1 as the other of the complementary data is outputted from a node N3 that is a contact node between the transistors 333 and 334.

The node NO of the tri-state buffer circuit 320 and the node N2 of the tri-state buffer circuit 330 are subjected to wired OR connection. Similarly, the node N1 of the tri-state buffer circuit 320 and the node N3 of the tri-state buffer circuit 330 are subjected to wired OR connection.

As described above, only one of the output signals of the AND gate circuits 311 to 314 becomes the low level, and all of the remaining three output signals become the high level. Accordingly, only one p-channel MOS transistor and one n-channel MOS transistor are always turned on, among the transistors constituting the tri-state buffer circuits 320 and 330, and all of the remaining transistors are turned off. When, for example, the output signal of the AND gate circuit 311 is the low level, only the transistors 322 and 323 are turned on, and therefore the node NO is driven at the low level and the node N1 is driven at the high level. At this time, the nodes N2 and N3 of the tri-state buffer circuit 330 are in a high impedance state.

When the enable signals EN0 to EN3 are activated to the high level one by one according to the above-described structure, the internal data signals DAT0/DAC0 to DAT3/DAC3 that are inputted in parallel and are complementary to each other are converted by the serializer 300 into the serial complementary data DT1/DC1. During the period to output the read data DQ, the complementary data DT1/DC1 control the pull-up buffer circuit 100 and the pull-down buffer circuit 200 in such a manner that one of these is turned on and the other is turned off based on a logic level of the read data DQ to be outputted. Meanwhile, during the period when the read data DQ is not outputted, that is, during the periods before and after outputting the read data DQ, the logic of the complementary data DT1/DC1 is fixed so that the pull-up buffer circuit 100 is turned on and the pull-down buffer circuit 200 is turned off. The circuit structure and the function of the serializer 300 have been described thus far.

Four pairs (four bits) of complementary signals DAT0/DAC0 to DAT3/DAC3 are supplied in parallel to the serializer 300 as shown in FIG. 5. Eight (four bits×2) input signal lines 700 and 702 are provided for the signals of the eight types in total. In generalization, the n×2 input signal lines 700 and 702 are provided for n pairs (n is a natural number more than one) of the complementary signals DAT0/DAC0 to DAT(n−1)/DAC(n−1).

The serializer 300 outputs a pair (one bit) of the complementary signals DT1/DC1. Two (one bit×2) output signal lines 706 are provided for the signals of the two types in total. The number of the output signal lines is two without regard for the number of the input signal lines. The output signal line 706 for the internal data signal DT1 (positive-phase signal) may be referred to as a "first output signal line" and the output signal line 706 for the internal data signal DC1 (negative-phase signal) may be referred to as a "second output signal line".

It should be noted that, among the internal data signals DAT0/DAC0 to DAT3/DAC3 inputted to the serializer 300, the positive-phase signals DAT0 to DAT3 may be referred to as "first internal data signals", and negative-phase signals DAC0 to DAC3 may be referred to as "second internal data signals". Among the internal data signals DT1/DC1 outputted from the serializer 300, the positive-phase signal DT1 may be referred to as a "third internal data signal", and the negative-phase signal DC1 may be referred to as a "fourth internal data signal". The inputted internal data signals (the first and the second internal data signals) may be collectively referred to as "input data signals", and the outputted internal data signals (the third and the fourth internal data signals) may be collectively referred to as "output data signals". The tri-state buffer circuits 320 and 330 may be referred to as "output selection circuits", the power supply line supplying the power supply potential VPERI may be referred to as a "third power supply line", and the power supply line supplying the ground potential VSS may be referred to as a "fourth power supply line" in the tri-state buffer circuits 320 and 330.

The eight (n×2) input signal lines 700 and 702 that pass through the eight NAND gate circuits 301 to 308 are combined into four (n) relay signal lines 704 by the four AND gate circuits 311 to 314, and connected to the two tri-state buffer circuits 320 and 330 in the end. In other words, when any one of the eight input signal lines 700 and 702 is activated to a low level, any one of the four relay signal lines 704 is activated to a low level, so that one of the internal data signals DT1/DC1 is set to the high level, and the other to the low level.

Each of the tri-state buffer circuits 320 and 330 is provided for every two bits (2 pairs) of input data signals. Specifically, the tri-state buffer circuit 320 corresponds to the two-bit input data signals DAT0/DAC0 and DAT1/DAC1, and the tri-state buffer circuit 330 corresponds to the two-bit input data signals DAT2/DAC2 and DAT3/DAC3.

Turning back to FIG. 4, the complementary data DT1/DC1 are latched by a latch circuit 360 and level-shifted by a level shifter 370. The level shifter 370 is a circuit for shifting amplitude of the complementary data DT1/DC1 from the VPERI level to the VDD level. This is because the amplitude of the read data DQ to be outputted to the outside of the semiconductor device 10 needs to have the VDD level that is equal to the external voltage, whereas the amplitude of the internal signals has the VPERI level. The complementary data DT2/DC2 outputted from the level shifter 370 are phase-compensated by compensation circuits 381 and 382 and thereafter, transmitted via lines 383 and 384.

Specifically, the latch circuit 360 synthesizes an inverted signal (positive-phase signal) of the internal data signal DC1 (negative-phase signal) with the internal data signal DT1 (positive-phase signal), and synthesizes an inverted signal (negative-phase signal) of the internal data signal DT1 (positive-phase signal) with the internal data signal DC1 (negative-phase signal). The latch circuit 360 is referred to as an "adjustment circuit". The amplitude value of the internal data signal DT1 (third internal data signal) is converted to the VDD level by the level shifter 370 to become an internal data signal DT2. The internal data signal DT2 is referred to as a "fifth internal data signal". Similarly, the amplitude value of the internal data signal DC1 (fourth internal data signal) is converted to the VDD level by the level shifter 370 to become an internal data signal DC2. The internal data signal DC2 is referred to as a "sixth internal data signal". The internal data signal DT1 and the internal data signal DC1 are complementary to each other, and therefore, the internal data signal DT2 and the internal data signal DC2 are also complementary to each other.

The complementary data DT1/DC1 (complementary data DT2/DC2) are binary signals, one of which has the high level and the other has the low level at all times. Therefore, a pair of the complementary signals can represent one-bit data only. This means that only the following two ways can be specified by the complementary data DT1/DC1 (complementary data DT2/DC2), that is, either the pull-up buffer circuit 100 is turned on and the pull-down buffer circuit 200 is turned off or the pull-up buffer circuit 100 is turned off and the pull-down buffer circuit 200 is turned on. In other words, it is impossible for the complementary data DT1/DC1 (complementary data DT2/DC2) to turn on or off both of the pull-up buffer circuit 100 and the pull-down buffer circuit 200. Operation for turning on and off both of the buffer circuits 100 and 200, that is, enabling operation of the buffer circuits 100 and 200 is performed by an impedance control circuit 500 that will be described later.

The complementary data DT2/DC2 transmitted via the lines 383 and 384 are converted into single-ended control signals DP and DN by regenerative circuits 385 and 386. The control signal DP is supplied to an output control circuit 400P, and the control signal DN is supplied to an output control circuit 400N. The output control circuit 400P is a circuit block for controlling the pull-up buffer circuit 100, and the output control circuit 400N is a circuit block for controlling the pull-down buffer circuit 200. In FIG. 4, the output control circuits 400P and 400N are represented by some gate circuit symbols, which are images for explaining functions of the output control circuits 400P and 400N and are not representing the actual circuit structures.

According to the present embodiment, the output control circuits 400P and 400N may be referred to as "fourth control circuits".

Figure 6:
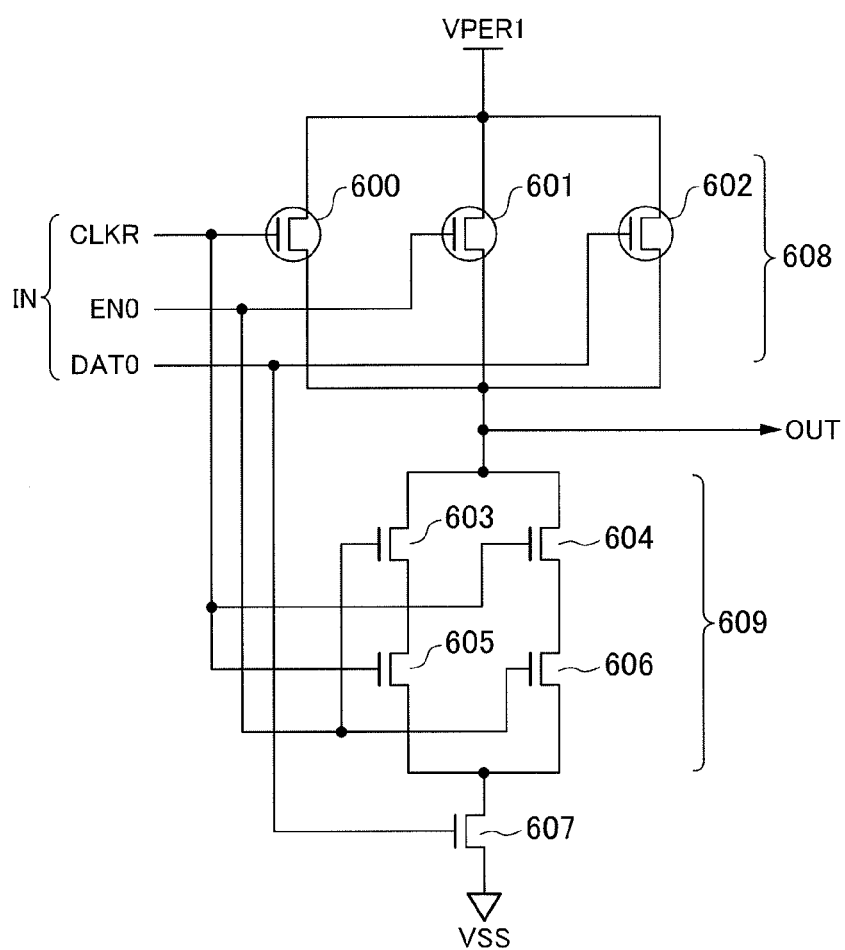
FIG. 6 is a circuit diagram of the three-input NAND gate circuit shown in FIG. 5.

A circuit diagram of the three-input NAND gate circuit 301, which is the same as the structure of other NAND gate circuits 302 to 308 will be explained with reference to FIG. 6. As shown in FIG. 6, the NAND gate circuit 301 includes a high voltage part 608 and a low voltage part 609. The high voltage part 608 includes pMOS transistors 600 to 602, and the low voltage part 609 includes nMOS transistors 603 to 607. An output signal OUT is taken out from a connection node between the high voltage part 608 and the low voltage part 609.

More specifically, the high voltage part 608 has the pMOS transistors 600 to 602 connected in parallel. Each of the pMOS transistors 600 to 602 is supplied with the power supply potential VPERI at a source, and controlled to turn on/off by the rising clock signal CLKR, the enable signal EN0, and the internal data signal DAT0, respectively. This means that, when either one of the three types of the input signals IN is at the low level, the power supply potential VPERI is supplied to the connection node between the high voltage part 608 and the low voltage part 609.

In the low voltage part 609, on-off control of the nMOS transistors 603 and 606 is performed based on the enable signal EN0, on-off control of the nMOS transistors 604 and 605 is performed based on the rising clock signal CLKR, and on-off control of the nMOS transistor 607 is performed based on the internal data signal DAT0. The ground potential VSS is supplied to a source of the nMOS transistor 607. The ground potential VSS is supplied to the connection node between the high voltage part 608 and the low voltage part 609 only when all of the three types of the input signals IN are at the high level, accordingly.

This means that, in the NAND gate circuit 301, the output signal OUT becomes the high level when at least one of the input signals IN is at the low level, and the output signal OUT becomes the low level when all of the input signals IN are at the high level.

Figure 7:
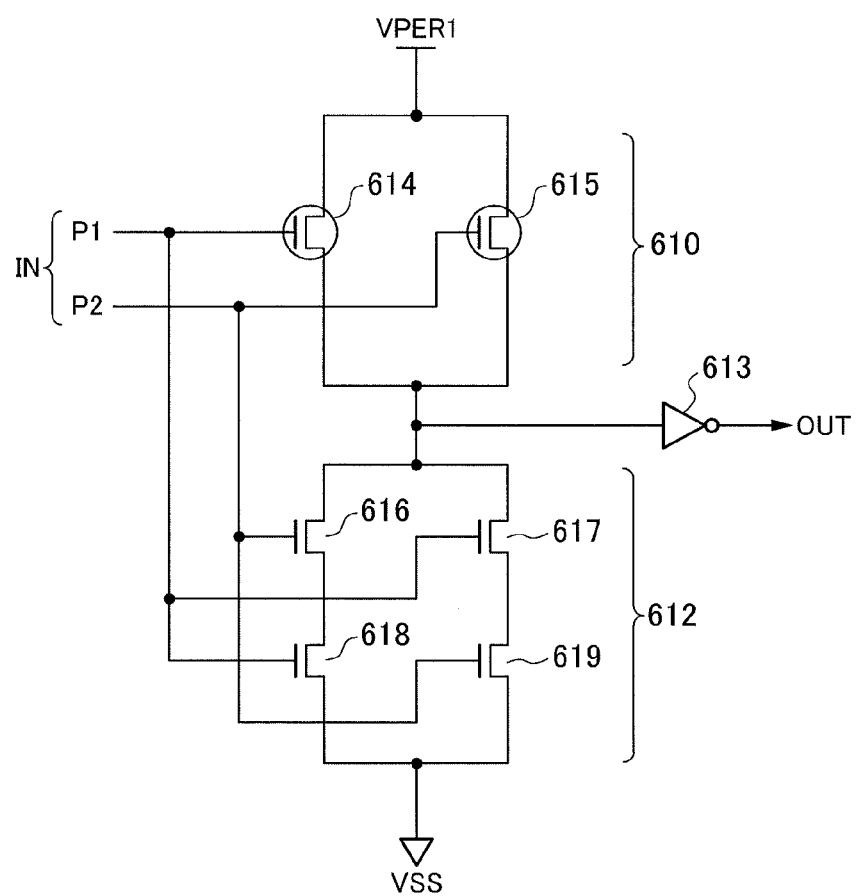
FIG. 7 is a circuit diagram of the two-input AND gate circuit shown in FIG. 5.

A circuit diagram of the two-input AND gate circuit 311, which is the same as the structure of other AND gate circuits 312 to 314 will be explained with reference to FIG. 7. As shown in FIG. 7, the AND gate circuit 311 includes a high voltage part 610 and a low voltage part 612. The high voltage part 610 includes pMOS transistors 614 and 615, and the low voltage part 612 includes nMOS transistors 616 to 619. An output signal OUT is taken out from a connection node between the high voltage part 610 and the low voltage part 612 via an inverter 613.

More specifically, the high voltage part 610 has the pMOS transistors 614 and 615 connected in parallel. Each of the pMOS transistors 614 and 615 is supplied with the power supply potential VPERI at a source, and controlled to turn on/off by input signals IN (P1 and P2) respectively. This means that, when either one of the two types of the input signals IN is at the low level, the power supply potential VPERI is supplied to the connection node between the high voltage part 610 and the low voltage part 612.

In the low voltage part 612, on-off control of the nMOS transistors 617 and 618 is performed based on the input signal P1, and on-off control of the nMOS transistors 616 and 619 is performed based on the input signal P2. The ground potential VSS is supplied to source of the nMOS transistors 618 and 619. The ground potential VSS is supplied to the connection node between the high voltage part 610 and the low voltage part 612 only when both of the two types of the input signals IN are at the high level, accordingly.

In the AND gate circuit 311, the output signal OUT becomes the low level when at least one of the input signals IN is at the low level, and the output signal OUT becomes the high level when all of the input signals IN are at the high level.

Figure 8:
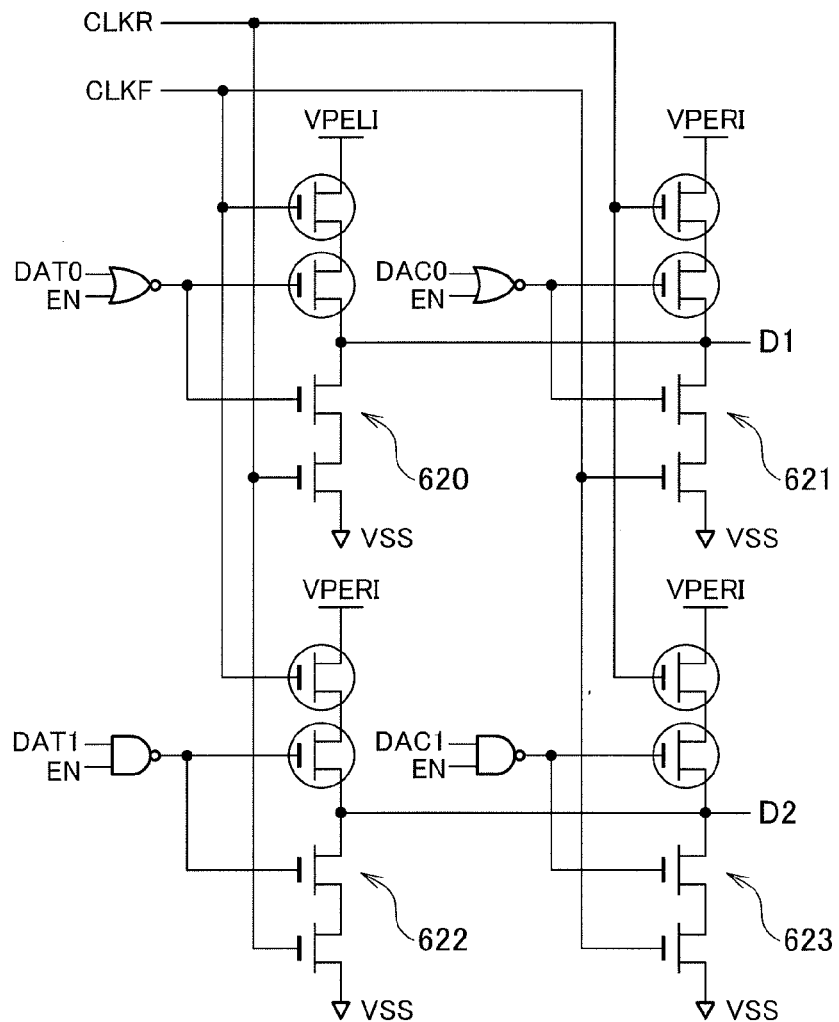
FIG. 8 is a circuit diagram of a serializer that the inventors have conceived as a prototype in the course of making the present invention.

Turning to FIG. 8 that shows a prototype of a serializer 660, four tri-state buffer circuits 620 to 623 (output selection circuits) are provided for two pairs (two bits) of input data signals DAT0/DAC0 and DAT1/DAC1. Output data signals D1 and D2 from the serializer 660 are not complementary to each other. Four combinations of the output data signals D1 and D2 are possible, that is, the output data signals D1/D2 are at the high level/low level, low level/high level, and also high level/high level, and low level/low level. As the two-bit signals can be outputted by the serializer 660 according to the prototype example, it is possible to set the ODT state or the high impedance state by the control of the serializer 660.

In the tri-state buffer circuit 620, two pMOS transistors and two nMOS transistors are connected in series between the power supply potential VPERI and the ground potential VSS, and an output signal line is provided at a connection node between the pMOS transistors and the nMOS transistors. This is the same as the structure of other tri-state buffer circuits 621, 622 and 623.

The output signal lines of the tri-state buffer circuits 620 and 621 are subjected to wired-OR connection, and its output becomes the output data signal D1. Output signal lines of the tri-state buffer circuits 622 and 623 are also subjected to wired-OR connection, and its output becomes the output data signal D2.

The four tri-state buffer circuits 620 to 623 are controlled by the input signals DAT0/DAC0, DAT1/DAC1 and EN that are three bits in total. It is necessary to provide a tri-state buffer circuit for each input data signal. This means that the four tri-state buffer circuits 620 to 623 are required for the four types of the input data signals DAT0/DAC0 and DAT1/DAC1. In order to deal with the input data signals DAT0/DAC0 to DAT3/DAC3 of four bits, eight tri-state buffer circuits are required. Moreover, the two transistors are connected in series between the power supply potential VPERI or the ground potential VSS and the output signal line, which causes a problem that a voltage range of the output data signal decreases.

Although the serializer 660 according to the prototype example has the advantage that the two-bit signals can be outputted therefrom, it also has the disadvantages that an output load tends to increase and signal quality is likely to deteriorate, due to a large number of the tri-state buffer circuits subjected to the wired OR connection. The deterioration of the signal quality tends to become serious especially when performing high-speed processing of the input data signals of a large number of bits.

With the serializer 300 according to this embodiment shown in FIG. 4, on the contrary, only the two tri-state buffer circuits are required for the four-bit input data signals. Moreover, only one transistor is provided between the power supply potential VPERI or the ground potential VSS and the output signal line, which has the advantage that the voltage range of the output data signal relatively increases. At an input stage to the tri-state buffer circuits, the signal is selected by the NAND gate circuits 301 to 308 and the AND gate circuits 311 to 314, which makes it possible to control the output load of the tri-state buffer circuits to a great extent.

It should be noted that the output data signals DT1/DC1 of the serializer 300 according to this embodiment are complementary to each other and outputted as one bit. Since it is impossible for the serializer 300 alone to set the output buffer circuit 70 to be in the ODT state or the high impedance state, the setting of the CDT state or the high impedance state is made by the impedance control circuit 500 that is connected to its subsequent stage. With the serializer 300 outputting the one-bit complementary signals DT1/DC1 according to this embodiment, the signal quality can be maintained more easily than the serializer 660 outputting the two-bit signals according to the prototype example, so that it is possible to deal with a further increase in speed of the DRAM and also with an increase in the number of bits to be able to be read out simultaneously from the memory cell array 11.

Figure 9:
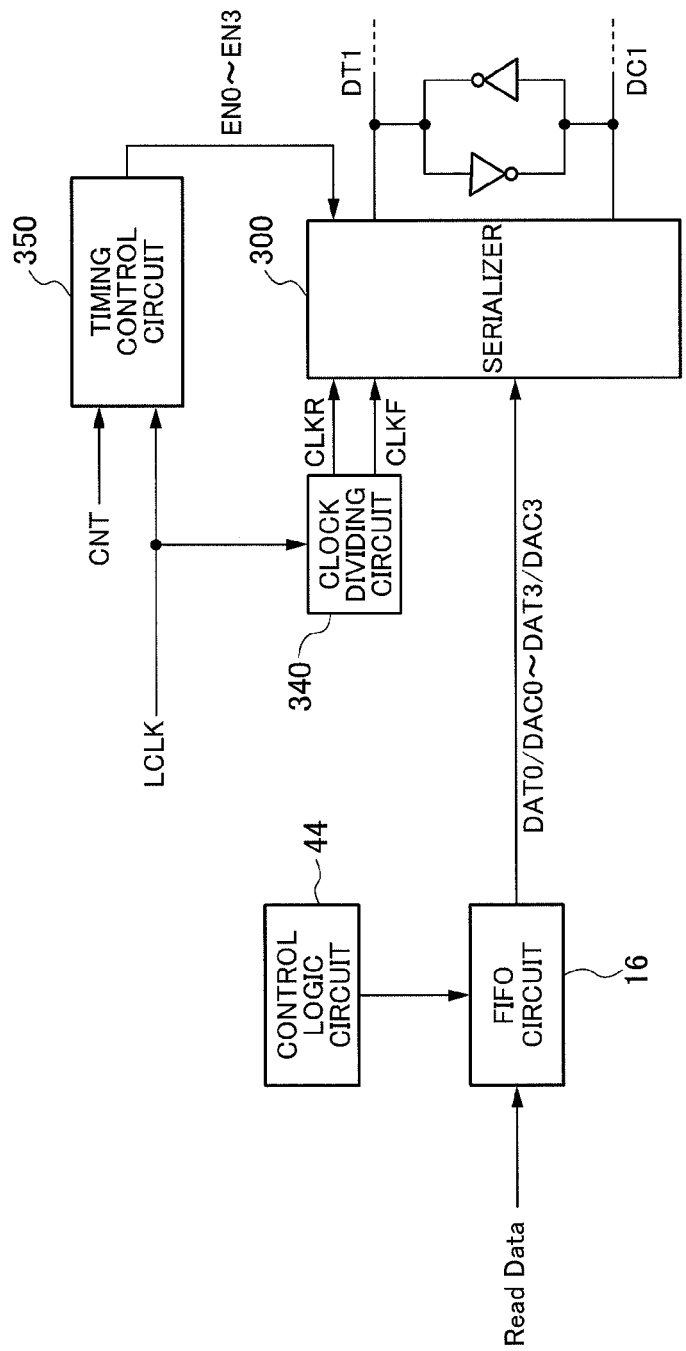
FIG. 9 shows circuit blocks connected to the serializer shown in FIG. 4.

As shown in FIG. 9, the FIFO circuit 16 reads out data by eight bits from the memory cell array 11 by the control of the control logic circuit 44. The FIFO circuit 16 buffers the eight-bit data sequentially, and outputs these by four bits as the complementary signals to the serializer 300. These four-bit complementary signals correspond to the input data signals DAT0/DAC0 to DAT3/DAC3.

Figure 10:
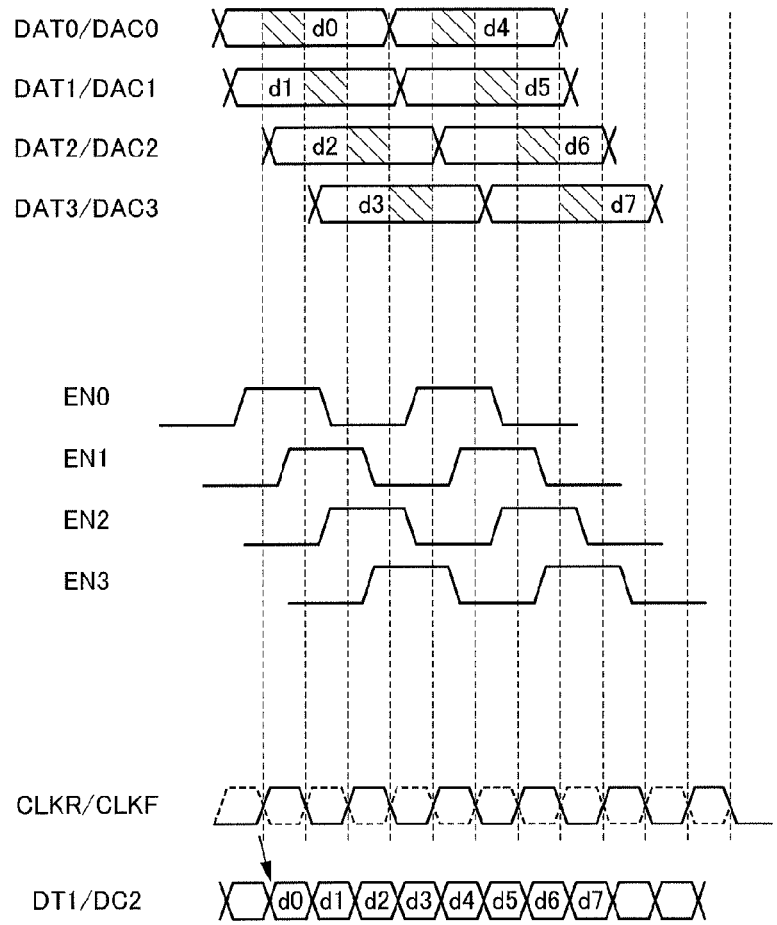
FIG. 10 is a timing chart for explaining an operation of the serializer shown in FIG. 5.

An operation of the serializer 300 will be explained with reference to FIG. 10. Here, the eight-bit data that are simultaneously read out from the memory cell array 11 are represented as d0 to d7. The FIFO circuit 16 supplies the first four bits d0 to d3 to the serializer 300, and then supplies the remaining four bits d4 to d7. The four-bit data d0 to d3 are supplied to the serializer 300 as four pairs of the data signals DAT0/DAC0 to DAT0/DAC3, and thereafter, the four-bit data d4 to d7 are supplied to the serializer 300 as the four pairs of the data signals DAT0/DAC0 to DAT0/DAC3 again.

The timing control circuit 350 supplies the four-bit enable signals EN0 to EN3 to the serializer 300. When the enable signal EN0 is made high active, the bit d0 (DAT0/DAC0) is latched in synchronization with the rising clock signal CLKR and outputted as the internal data signals DT1/DC1. When the enable signal EN1 is made high active next, the bit d1 (DAT1/DAC1) is latched and outputted as the internal data signals DT1/DC1. Similarly, each bit of the eight-bit data signals d0 to d7 is outputted as the internal data signals DT1/DT1.

Figure 11:
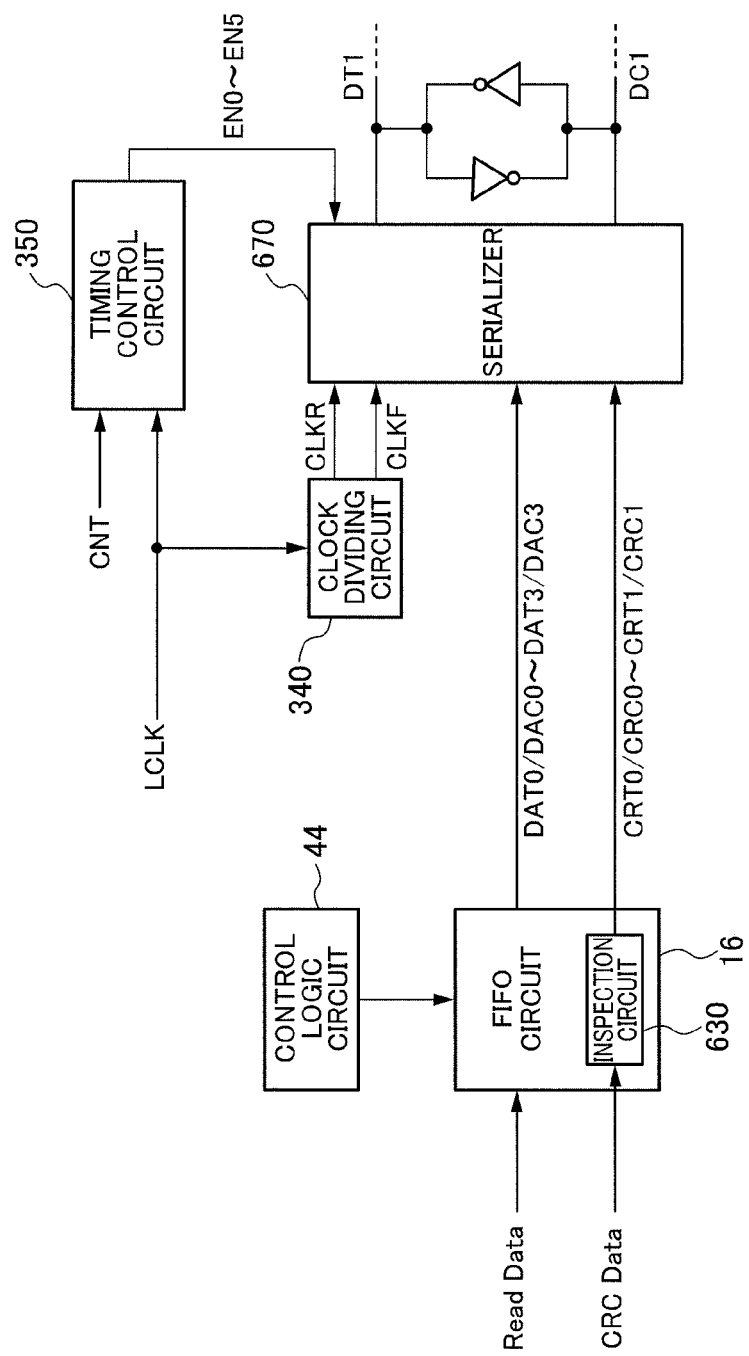
FIG. 11 shows circuit blocks connected to a CRC serializer that can performs CRC operation.

The FIFO circuit 16 shown in FIG. 11 contains an inspection circuit 630. CRC (Cyclic Redundancy Check) is supported in DDR4 (Double Data Rate 4) SDRAM. A CRC signal is a signal to check if an error exists in the read-out data or not. The inspection circuit 630 supplies the two-bit CRC signals to the serializer 300. As a result of this, the serializer 670 receives the two-bit CRC signals CRT0/CRC0 and CRT1/CRC1, in addition to the eight-bit read data. Corresponding to the two-bit CRC signals CRT0/CRC0 and CRT1/CRC1, the timing control circuit 350 further supplies enable signals EN4 and EN5 to the serializer 300.

Figure 12:
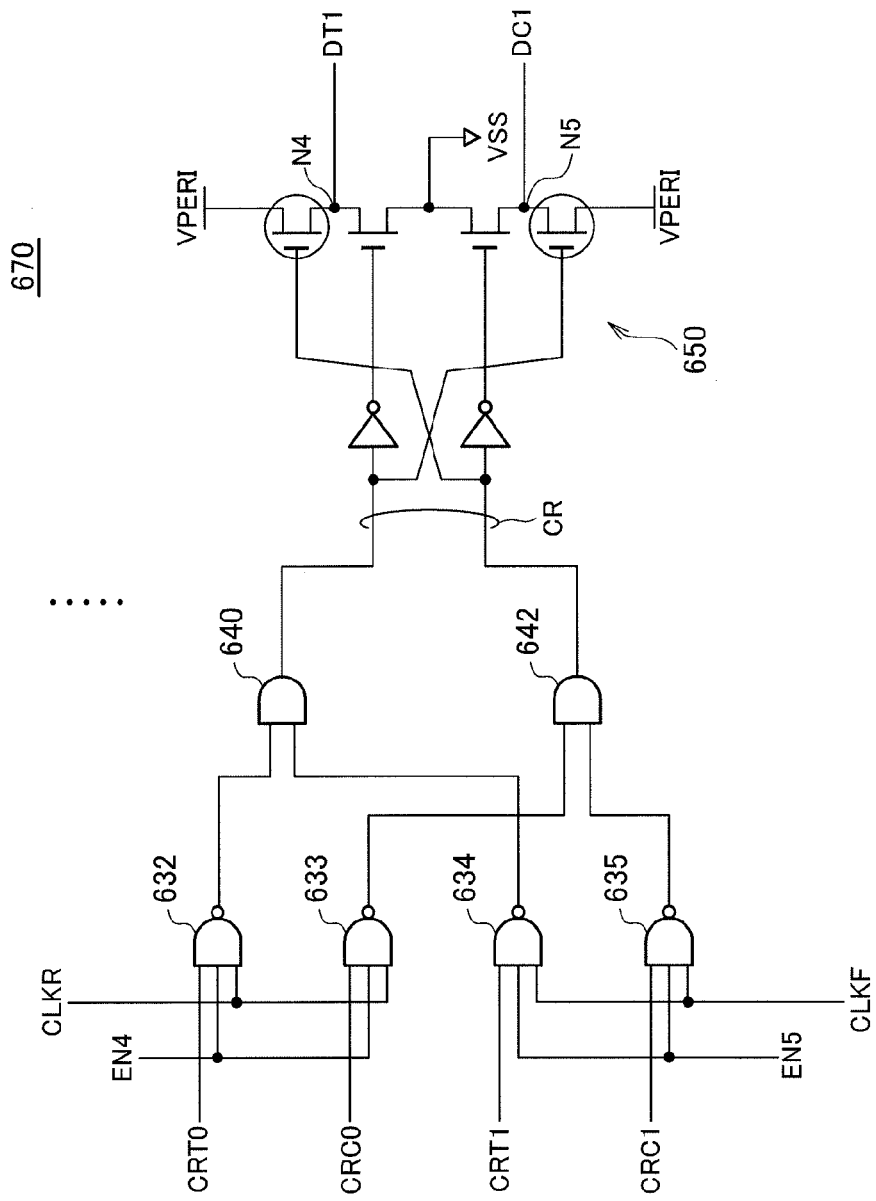
FIG. 12 is a partial circuit diagram of the CRC serializer shown in FIG. 11.

A partial circuit diagram of the CRC serializer 670 is shown in FIG. 12. Only the circuit relating to processing of the CRC signals in the serializer 670 is illustrated here. The circuit structure relating to processing of the normal internal data signals is the same as that shown in FIG. 5. Similarly to the internal data signals DAT0/DAC0 to DAT3/DAC3, the two-bit CRC signals CRT0/CRC0 and CRT1/CRC1 are also controlled based on the clock signals CLKR and CLKF and the enable signals EN4 and EN5. In the CRC serializer 670, two-input NAND circuits 632 to 635 are added to the three-input NAND gate circuits 301 to 308, two-input AND circuits 640 and 642 are added to the two-input AND circuits 311 to 314, and a tri-state buffer circuit 650 is added to the tri-state buffer circuits 320 and 330. The CRC signals CRT0/CRC0 and CRT1/CRC1 are respectively supplied to first input nodes of the NAND gate circuits 632 to 635. The rising clock signal CLKR is supplied to second input nodes of the NAND gate circuits 632 and 633, and the falling clock signal CLKF is supplied to second input nodes of the NAND gate circuits 634 and 635. The enable signal EN4 is supplied to third input nodes of the NAND circuits 632 and 633, and the enable signal EN5 is supplied to third input nodes of the NAND gate circuits 634 and 635.

As the enable signals EN0 to EN6 are not activated simultaneously, only one of output signals of the NAND circuits 301 to 308 and 632 to 635 becomes the low level, and all of the remaining output signals become the high level.

The output signals of the NAND gate circuits 632 and 633 are supplied to the AND gate circuit 640, and the output signals of the NAND gate circuits 634 and 635 are supplied to the AND gate circuit 642. Thus, only one of the output signals of the AND gate circuits 311 to 314, 640 and 642 becomes the low level, and all of the remaining five output signals become the high level. Output signals CR of the AND gate circuits 640 and 642 are supplied to the tri-state buffer circuit 650. The structure of the tri-state buffer circuit 650 is the same as those of the tri-state buffer circuits 320 and 330.

A node N4 of the tri-state buffer circuit 650 and the nodes N0 and N2 of the tri-state buffer circuits 320 and 330 are subjected to wired OR connection. Similarly, a node N5 of the tri-state buffer circuit 650 and the nodes N1 and N3 of the tri-state buffer circuits 320 and 330 are subjected to wired OR connection.

As described above, only one of the output signals of the AND gate circuits 311 to 314, 640 and 642 becomes the low level, and all of the remaining five output signals become the high level. Therefore, only one p-channel MOS transistor and one n-channel MOS transistor are always turned on, and all of the remaining transistors are turned off, among the transistors constituting the tri-state buffer circuits 320, 330 and 650.

According to the structure as above, the enable signals EN0 to EN5 are sequentially activated to the high level, so that the serializer 670 converts the internal data signals DAT0/DAC0 to DAT3/DAC3, CRT0/CRC0 and CRT1/CRC1, inputted in parallel and complementary to each other, into the serial complementary data DT1/DC1.

Among the CRC signals CRT0/CRC0 and CRT1/CRC1 inputted into the serializer 670, the positive-phase signals CRT0 and CRT1 may be referred to as "first error detection signals", and the negative-phase signals CRC0 and CRC1 may be referred to as "second error detection signals". Moreover, the CRC signals outputted from the serializer 670 as DT1/DC1 may be referred to as a "third error detection signal" and a "fourth error detection signal", respectively.

Figure 13:
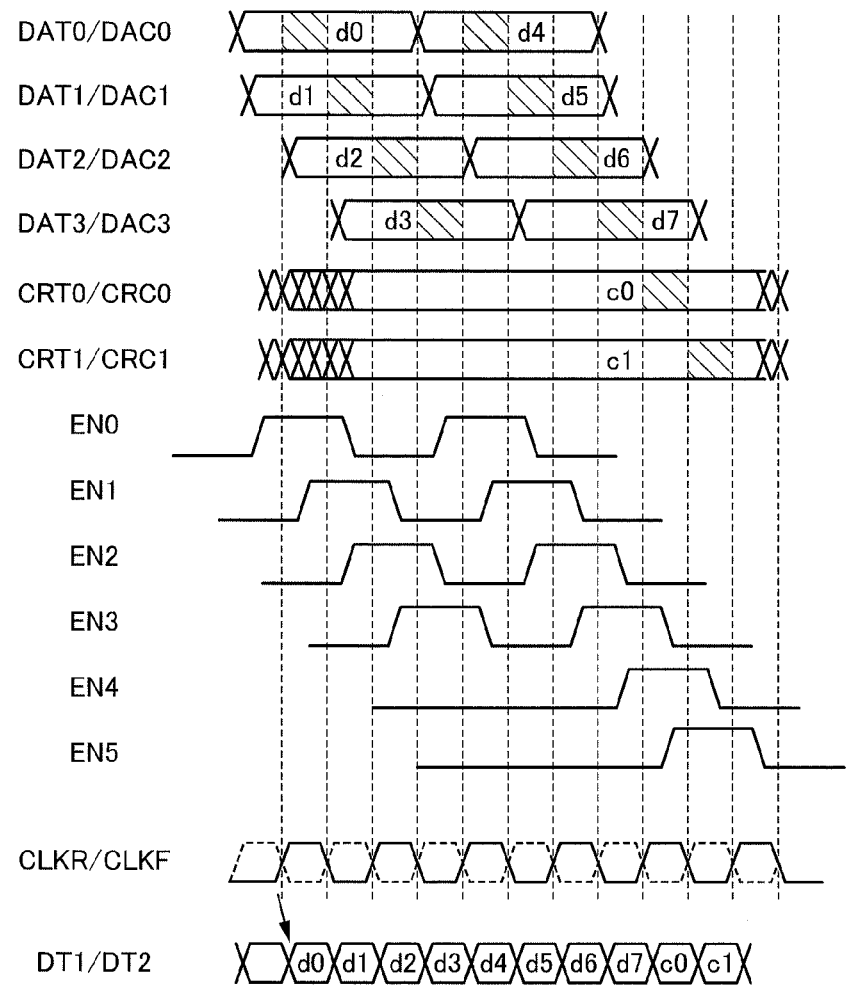
FIG. 13 is a timing chart for explaining an operation of the serializer shown in FIG. 11.

An operation of the CRC serializer 670 will be explained with reference to FIG. 13. The FIFO circuit 16 supplies first four bits d0 to d3 to the serializer 670, and then supplies remaining four bits d4 to d7 to the serializer 670. Simultaneously with the bit data d0 to d7, two-bit CRC signals c0 and c1 (CRT0/CRC0 and CRT1/CRC1) are supplied to the serializer 670.

The timing control circuit 350 supplies the two-bit enable signals EN4 and EN5, in addition to the four-bit enable signals EN0 to EN3, to the serializer 670. When the enable signal EN4 is made high active, the bit c0 (CRT0/CRC0) is latched and outputted as the internal data signals DT1/DC1. When the enable signal EN5 is made high active, the bit c1 (CRT1/CRC1) is latched and outputted as the internal data signals DT1/DC1. As the enable signals EN4 and EN5 are activated after the enable signals EN0 to EN3 are respectively activated twice, the CRC signals c0 and c1 are outputted after the bit string of d0 to d7 is sequentially outputted from the serializer 670.

Figure 14:
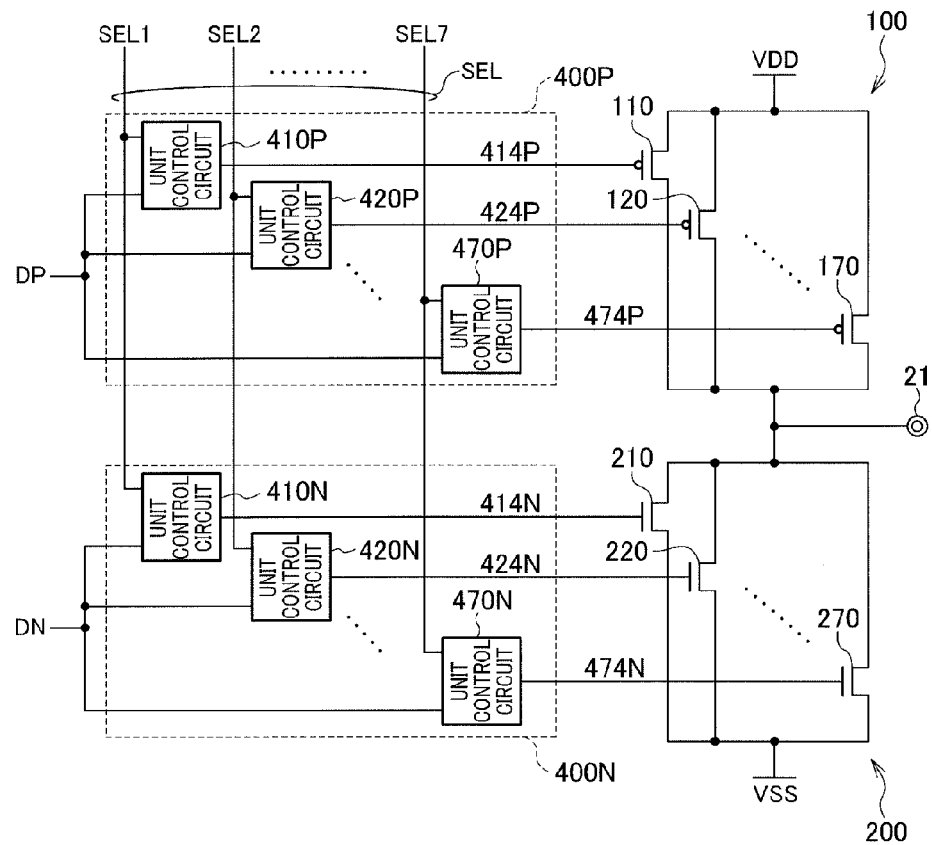
FIG. 14 is a circuit diagram showing the pull-up buffer circuit, the pull-down buffer circuit, and the output control circuits shown in FIG. 4.

Turning to FIG. 14, the pull-up buffer circuit 100 includes a plurality of unit buffer circuits that are connected in parallel between the power supply line supplying the power supply potential VDD and the data terminal 21. In this embodiment, the pull-up buffer circuit 100 includes seven unit buffer circuits 110 to 170, although the number is not particularly limited. The seven unit buffer circuits 110 to 170 have the same impedance, and the impedance of the pull-up buffer circuit 100 when it is activated can be selected by selecting the number of the unit buffer circuits to be activated simultaneously. The impedance of the respective unit buffer circuits 110 to 170 is adjusted to a designed value (240Ω, for example) by a not-shown calibration circuit. The result of the calibration operation is obtained as a calibration code ZQCP that will be described later. In FIG. 14, each of the unit buffer circuits 110 to 170 is represented by a symbol of a p-channel MOS transistor, but in actuality, each unit buffer circuit does not necessarily consist of one transistor.

Similarly, the pull-down buffer circuit 200 includes a plurality of unit buffer circuits that are connected in parallel between the power supply line supplying the ground potential VSS and the data terminal 21. In this embodiment, the pull-down buffer circuit 200 includes seven unit buffer circuits 210 to 270, although the number is not particularly limited. The seven unit buffer circuits 210 to 270 have the same impedance, and the impedance of the pull-up buffer circuit 200 when it is activated can be selected by selecting the number of the unit buffer circuits to be activated simultaneously. The impedance of the respective unit buffer circuits 210 to 270 is adjusted to a designed value (240Ω, for example) by a not-shown calibration circuit. The result of the calibration operation is obtained as a calibration code ZQCN that will be described later. In FIG. 14, each of the unit buffer circuits 210 to 270 is represented by a symbol of an n-channel MOS transistor, but in actuality, each unit buffer circuit does not necessarily consist of one transistor.

The unit buffer circuits 110 to 170 are respectively controlled by unit control circuits 410P to 470P that are included in the output control circuit 400P. The unit control circuits 410P to 470P are controlled by the control signal DP and corresponding selection signals SELL to SEL7. Similarly, the unit buffer circuits 210 to 270 are respectively controlled by unit control circuits 410N to 470N that are included in the output control circuit 400N. The unit control circuits 410N to 470N are controlled by the control signal DN and the corresponding selection signals SEL1 to SEL7. The selection signals SEL1 to SEL7 are signals generated by the impedance control circuit 500 shown in FIG. 4.

Figure 15:
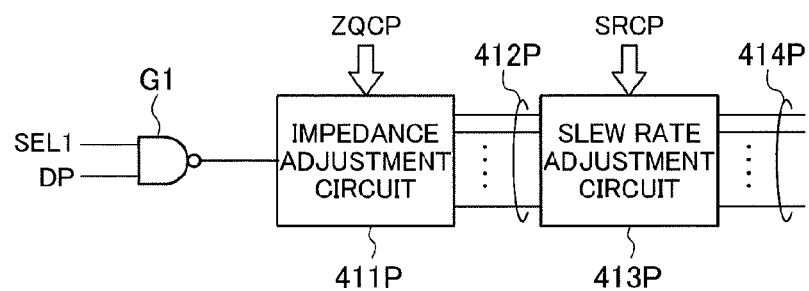
FIG. 15 is a circuit diagram of the unit control circuit 410P shown in FIG. 14.

As shown in FIG. 15, the unit control circuit 410P includes a NAND gate circuit G1 that receives the selection signal SEL1 and the control signal DP, an impedance adjustment circuit 411P that receives an output signal of the gate circuit G1, and a slew rate adjustment circuit 413P that receives an output signals of the impedance adjustment circuit 411P. When the output signal of the gate circuit G1 is activated to the low level, the impedance adjustment circuit 411P activates one or more bits of a control signal 412P consisting of a plurality of bits, based on the calibration code ZQCP. The slew rate adjustment circuit 413P adjusts change speed of the activated bit(s) of the control signal 412P, based on a slew rate code SRCP. The control signal 414P outputted from the slew rate adjustment circuit 413P is supplied to the unit buffer circuit 110.

Other unit control circuits 420P to 470P have the same circuit structure as that of the unit control circuit 410P shown in FIG. 15, except that the corresponding selection signals SEL2 to SEL7 are supplied thereto. The control signals 424P to 474P outputted from the unit control circuits 420P to 470P are supplied to the corresponding unit buffer circuits 120 to 170, respectively.

Figure 16:
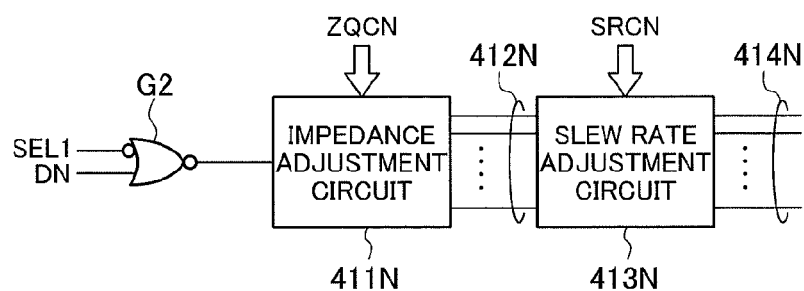
FIG. 16 is a circuit diagram of the unit control circuit 410N shown in FIG. 14.

As shown in FIG. 16, the unit control circuit 410N includes a NAND gate circuit G2 that receives the selection signal SEL1 and the control signal DN, an impedance adjustment circuit 411N that receives an output signal of the gate circuit G2, and a slew rate adjustment circuit 413N that receives an output signals of the impedance adjustment circuit 411N. When the output signal of the gate circuit G2 is activated to the high level, the impedance adjustment circuit 411N activates one or more bits of a control signal 412N consisting of a plurality of bits, based on the calibration code ZQCN. The slew rate adjustment circuit 413N adjusts change speed of the activated bit(s) of the control signal 412N, based on a slew rate code SRCN. The control signal 414N outputted from the slew rate adjustment circuit 413N is supplied to the unit buffer circuit 210.

Other unit control circuits 420N to 470N have the same circuit structure as that of the unit control circuit 410N shown in FIG. 16, except that the respective corresponding selection signals SEL2 to SEL7 are supplied thereto. The control signals 424N to 474N outputted from the unit control circuits 420N to 470N are supplied to the corresponding unit buffer circuits 220 to 270, respectively.

Figure 17:
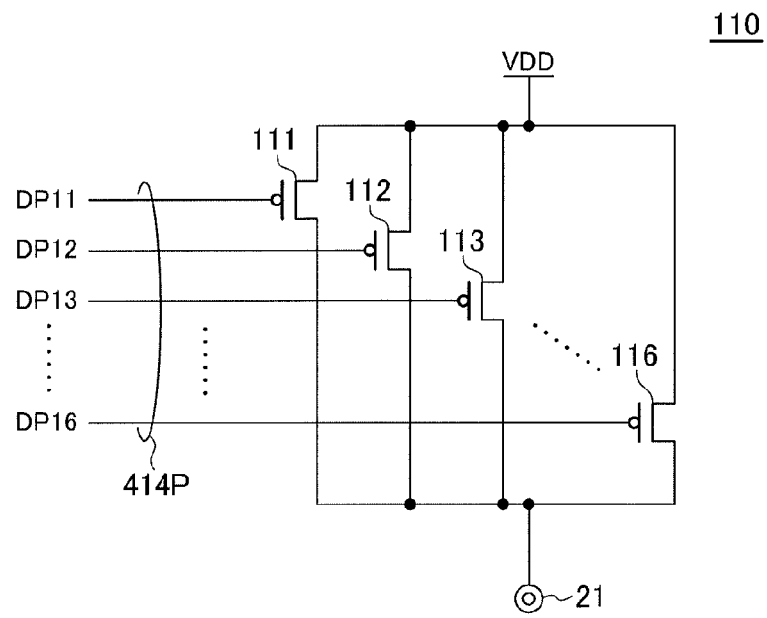
FIG. 17 is a circuit diagram of the unit buffer circuit 110 shown in FIG. 14.

As shown in FIG. 17, the unit buffer circuit 110 includes a plurality of p-channel MOS transistors 111 to 116 connected in parallel between the power supply line supplying the power supply potential VDD and the data terminal 21. Respective bits DP11 to DP16 constituting the control signal 414P are supplied to respective gate electrodes of the transistors 111 to 116. Thereby, the transistor corresponding to the low-level bit is turned on, among the respective bits DP11 to DP16 constituting the control signal 414P. A channel width of each of the transistors 111 to 115, among the transistors 111 to 116, is assigned a weight that is a power of two, although not particularly limited. Thus, on/off of the transistors 111 to 115 is specified based on the impedance code ZQCP. The transistor 116 is turned on without regard for the impedance code ZQCP.

Other unit buffer circuits 120 to 170 have the same circuit structure as that of the unit buffer circuit 110, except that the corresponding control signals 424P to 474P are supplied thereto.

Figure 18:
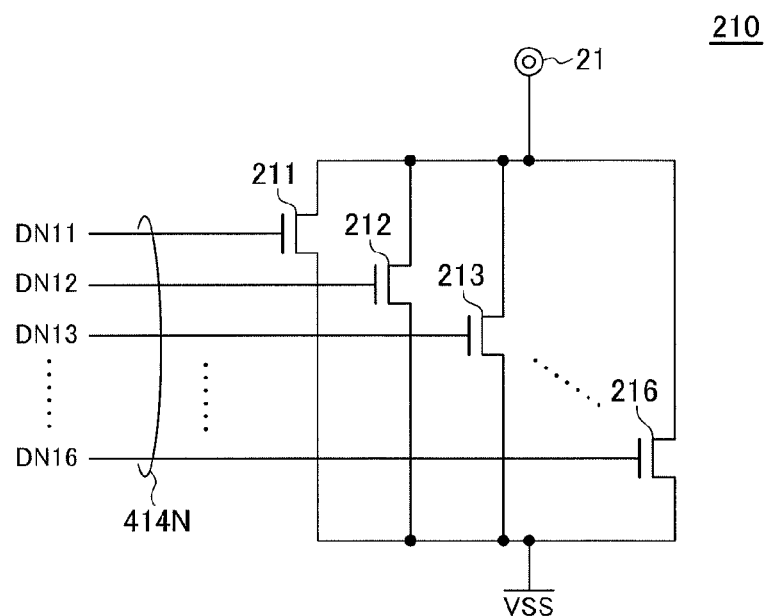
FIG. 18 is a circuit diagram of the unit buffer circuit 210 shown in FIG. 14.

As shown in FIG. 18, the unit buffer circuit 210 includes a plurality of n-channel MOS transistors 211 to 216 connected in parallel between the power supply line supplying the ground potential VSS and the data terminal 21. Respective bits DN11 to DN16 constituting the control signal 414N are supplied to respective gate electrodes of the transistors 211 to 216. Thereby, the transistor corresponding to the high-level bit is turned on, among the respective bits DN11 to DN16 constituting the control signal 414N. A channel width of each of the transistors 211 to 215, among the transistors 211 to 216, is assigned a weight that is a power of two, although not particularly limited. Thus, on/off of the transistors 211 to 215 is specified based on the impedance code ZQCN. The transistor 216 is turned on without regard for the impedance code ZQCN.

Other unit buffer circuits 220 to 270 have the same circuit structure as that of the unit buffer circuit 210, except that the corresponding control signals 424N to 474N are supplied thereto respectively.

Figures 19, 20:
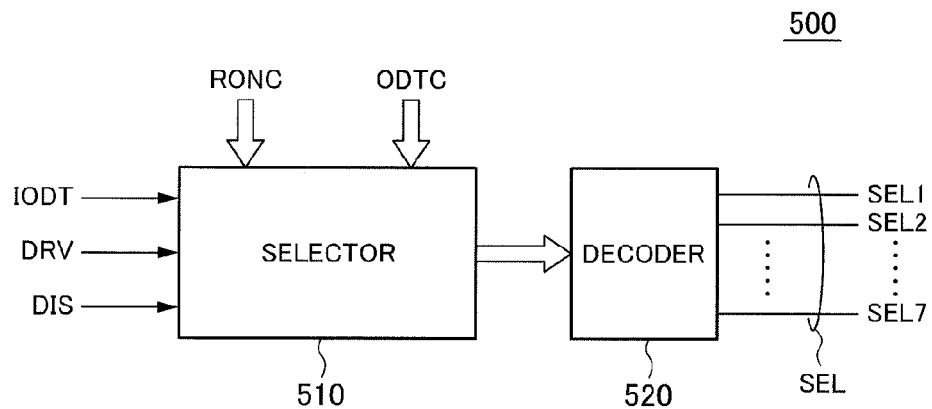
FIG. 19 is a block diagram showing the structure of the impedance control circuit shown in FIG. 4.
FIG. 20 is a truth table for explaining the selector shown in FIG. 19.

Turning Lo FIG. 19, the impedance control circuit 500 includes a selector 510 that receives the impedance codes RONC and ODTC, and a decoder 520 that decodes an output signals of the selector 510. The impedance code RONC is a signal that specifies the impedance when the pull-up buffer circuit 100 and the pull-down buffer circuit 200 are allowed to function as output circuits. Meanwhile, the impedance code ODTC is a signal that specifies the impedance when the pull-up buffer circuit 100 is allowed to function as a termination resistor. The pull-up buffer circuit 100 is allowed to function as the termination resistor when the termination signal ODT inputted in the ODT terminal 33 shown in FIG. 1 is activated. In this embodiment, the data terminal 21 has the termination level of VDD, and hence the pull-down buffer circuit 200 is not used as the termination resistor. The impedance codes RONC and ODTC need not to be fixed and preferably may be switched according to a set value of the mode register 42.

A termination signal IODT, a drive signal DRV and a disable signal DIS supplied to the selector are used to determine which of the impedance codes RONC and ODTC to be selected. The termination signal IODT is a signal activated to the low level in performing the ODT operation, and activated based on the termination signal ODT inputted into the ODT terminal 33. The drive signal DRV is a signal activated to the high level in performing output operation of the read data DQ. The disable signal DIS is a signal activated when the output buffer circuit 70 is made to be in the high impedance state. The impedance code RONC or ODTC is selected according to a truth table shown in FIG. 20. In this embodiment, the state in which the impedance code ODTC is selected may be referred to as a "first control state", and the state in which the impedance code RONC is selected may be referred to as a "second control state". Further, the impedance control circuit 500 may be referred to as a "second control circuit".

The drive signal DRV is a signal generated by the timing control circuit 350 shown in FIG. 4. By activating the drive signal DRV in synchronism with an output timing of the read data DQ, the timing control circuit 350 switches the output buffer circuit 70 that is performing the ODT operation to perform the output operation of the read data DQ, or switches the output buffer circuit 70 that is in the high impedance state to perform the output operation of the read data DQ. It is needless to say that the opposite control is also possible, that is, the output buffer circuit 70 that is performing the output operation of the read data DQ may be switched to perform the ODT operation, or to be in the high impedance state. According to the present embodiment, the timing control circuit 350 may be referred to as a "third control circuit".

The impedance code RONC or ODTC that is selected by the selector 510 is supplied to the decoder 520. Based on the impedance code, the decoder 520 controls the number of the selection signals SEL1 to SEL7 to be activated. As described above, the selection signals SEL1 to SEL7 are signals for activating the corresponding unit buffer circuits 110 to 170 and 210 to 270, respectively. As the number of the selection signals SEL1 to SEL7 to be activated increases, the impedance of the pull-up buffer circuit 100 or the pull-down buffer circuit 200 in the on-state is reduced. According to the present invention, the selection signals SEL1 to SEL7 may be referred to as "second control signals".

Figure 21:
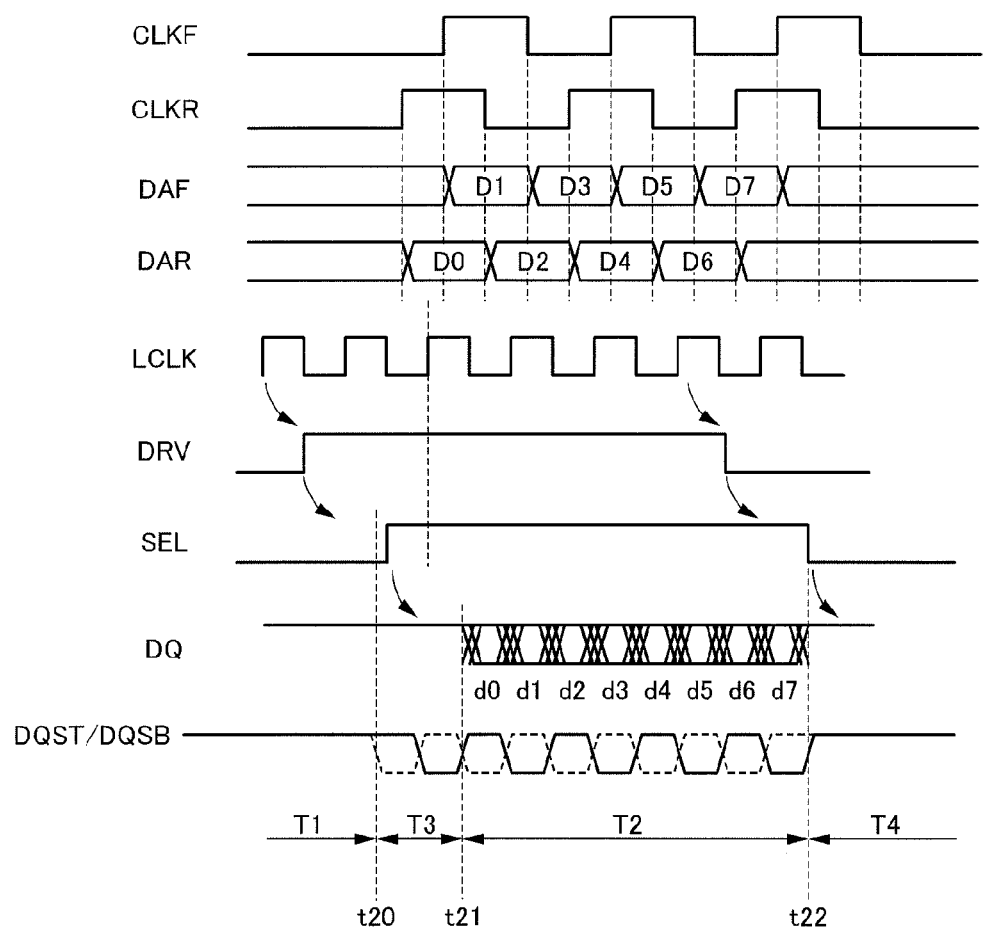
FIG. 21 is a timing chart for explaining the output operation of the read data according to one example.

According to one example shown in FIG. 21, the clocking of the strobe signals DQST/DQSB is started at a time t20, and the output of the read data DQ is started from a time t21 that is one clock cycle after the time t20. The output operation of the read data DQ is completed at a time t22. Therefore, the data terminal 21 needs to have the VDD level in control periods T1 and T3 before the time t21 and a control period T4 after the time t22.

In order to achieve this, it is necessary to perform the ODT operation by turning on the pull-up buffer circuit 100 only, or to allow the data terminal 21 to be in the high impedance state by turning off both of the pull-up buffer circuit 100 and the pull-down buffer circuit 200, during the control periods T1, T3 and T4. In performing the ODT operation, the impedance of the pull-up buffer circuit 100 needs to be controlled based on the impedance code ODTC. As described above, the impedance is controlled based on the impedance code ODTC by selecting the number of the unit buffer circuits 110 to 170 to be activated.

Meanwhile, during a control period T2 between the time t21 to the time t22, it is necessary to turn on either one of the pull-up buffer circuit 100 and the pull-down buffer circuit 200 and turn off the other, based on the logic level of the read data DQ to be outputted. In the output operation of the read data DQ, the impedance of the pull-up buffer circuit 100 needs to be controlled based on the impedance code RONC. The impedance is also control led based on the impedance code RONC by selecting the number of the unit buffer circuits 110 to 170 and 210 to 270 to be activated.

Here, the Liming to start the output of the read data DQ needs to coincide with the time 21 with precision. Such timing control is performed precisely by the serializer 300. On the other hand, it is not necessarily required to coincide the timing to switch the impedance of the pull-up buffer circuit 100, from the impedance based on the impedance code ODTC to the impedance based on the impedance code RONC, with the time t21. This is because the level of the data terminal 21 during the control period T1 before the time t20 and the level of the data terminal 21 during the control period T3 between the time t20 to the time t21 are equal to each other, and a change in the impedance of the pull-down buffer circuit 200 during the periods does not substantially affect other semiconductor devices connected to the semiconductor device 10.

Therefore, the timing to change the selection signals SEL1 to SEL7 may be at any moment as long as it is within the control period T3 from the time t20 to the time t21, which eliminates the need to strictly control the timing by using the output clock signal LCLK. As a result of this, as shown in FIG. 4, the selection signals SELL to SEL7 that specify the impedance of the pull-up buffer circuit 100 and the pull-down buffer circuit 200 can be inputted into the output control circuits 400P and 400N that are provided just before the buffer circuits 100 and 200, not into the serializer 300. In FIG. 21, the change in the selection signal SEL is schematically represented in binary. In FIG. 21, the low level of the selection signal SEL means that the impedance code ODTC is selected, and the high level of the selection signal SEL means that the impedance code RONC is selected.

Figure 22:
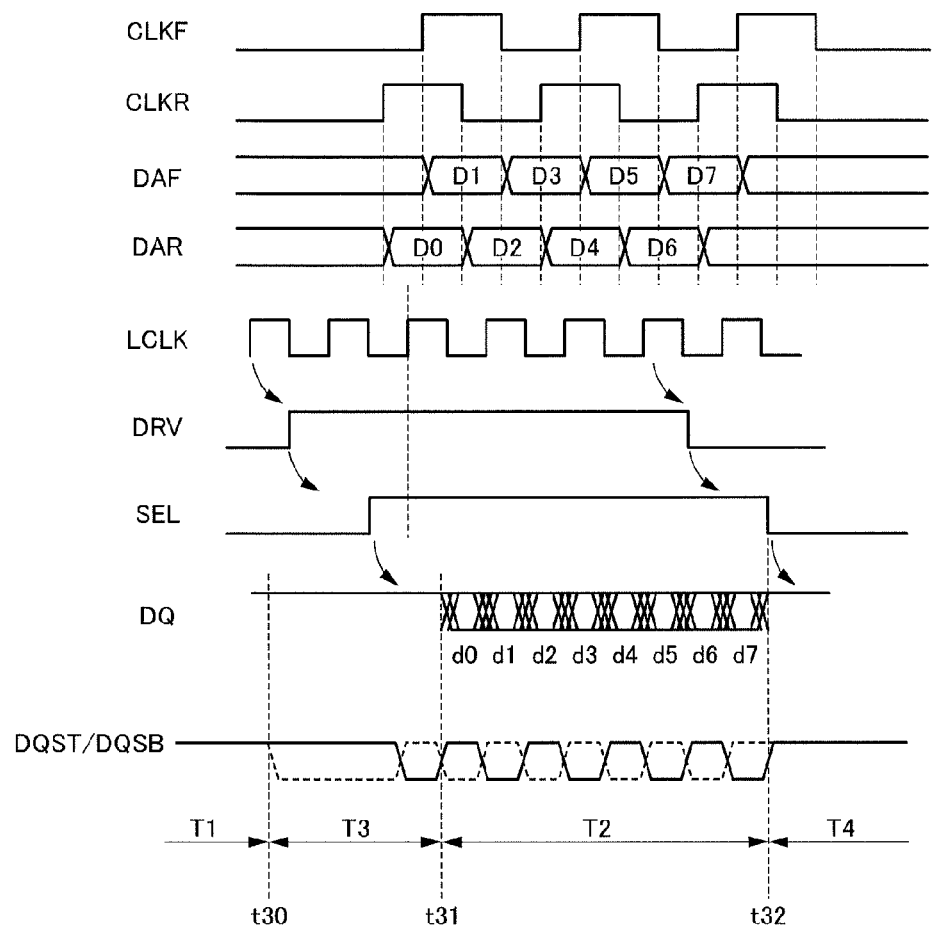
FIG. 22 is a timing chart for explaining the output operation of the read data according to another example.

FIG. 22 is a timing chart explaining the output operation of the read data DQ according to another example. According to the example shown in FIG. 22, the clocking of the strobe signals DQST/DQSB is started at a time t30, and the output of the read data DQ is started at a time t31 that is two clock cycles after the time t30. The output operation of the read data DQ is completed at a time t32. When the so-called preamble period is thus increased, a timing margin to switch the impedance of the pull-up buffer circuit 100 is also increased correspondingly.

Figure 23:
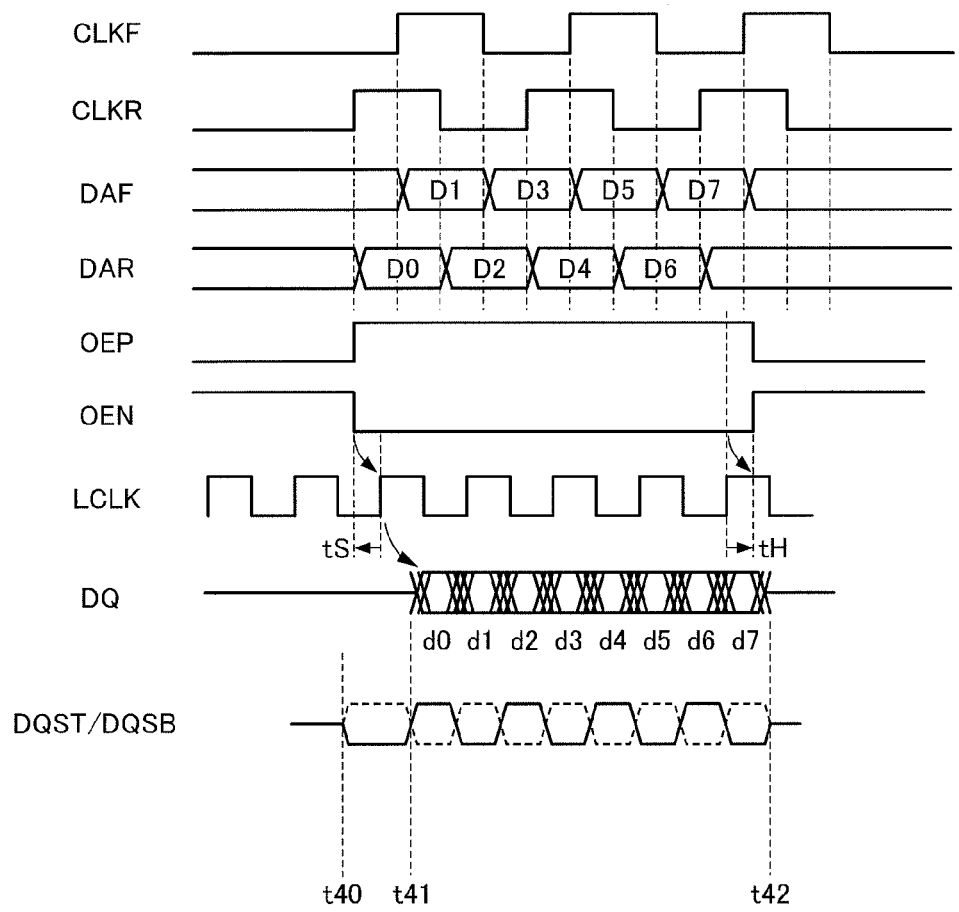
FIG. 23 is a timing chart that the inventors have conceived as a prototype in the course of making the present invention.

According to the prototype example shown in FIG. 23, the clocking of the strobe signals DQST/DQSB is started at a time t40, and the output of the read data DQ is started at a time t41 that is one clock cycle after the time t40. The output operation of the read data DQ is completed at a time t42. According to this prototype example, the termination level of the data terminal 21 is set to be VDD/2 as explained with reference to FIG. 3. In this case, the timing to switch the impedance of the output buffer circuit 70 needs to precisely coincide with the timing to start the output of the read data DQ. This means that it is necessary to input a signal for switching the impedance of the output buffer circuit 70 into the serializer. In FIG. 23, a signal to switch the impedance of the pull-up buffer circuit 100 is represented as OEP, and a signal to switch the impedance of the pull-down buffer circuit 200 is represented as OEN. Thus, according to this prototype example, the signals OEP and OEN need to be inputted into the serializer, which makes the timing margin severe irrespective of the length of the preamble period. In FIG. 23, a setup margin is represented as tS, and a hold margin is represented as tH.

On the contrary, the present embodiment has no such problems, and allows plenty of time to switch the impedance.

It is apparent that the present invention is not limited to the above embodiments, but may be modified and changed without departing from the scope and spirit of the invention.

What is claimed is:
1. A semiconductor device comprising:
a data terminal;
a first power supply line supplying a first potential;
a second power supply line supplying a second potential different from the first potential;
a first buffer circuit coupled between a first power supply line and the data terminal;

a second buffer circuit coupled between a second power supply line and the data terminal; and a first control circuit receiving n pairs of first and second internal data signals complementary to each other from 2n input signal lines, and outputting a pair of third and fourth internal data signals complementary to each other to first and second output signal lines, where n is a natural number more than one, wherein the first and second buffer circuits are controlled based on the third and fourth internal data signals such that one of the first and second buffer circuits turns on and the other of the first and second buffer circuits turns off, wherein the first control circuit includes at east one output selection circuit connected to the first and second output signal lines, the output selection circuit being provided for every two pairs of the first and the second internal data signals, and the output selection circuit drives one of the first and second output signal lines to the first logic level and drives the other of the first and second output signal lines to the second to level.

2. The semiconductor device as claimed in claim 1, wherein one of the first and second internal data signals on one of the 2n input signal lines is activated and remaining ones of the first and second internal data signals on remaining ones of the 2n input signal lines are deactivated, and the first control circuit drives one of the first and second output signal lines to a first logic level and drives the other of the first and second output signal lines to a second logic level based on the activated one of the first and second internal data signals.

3. The semiconductor device as claimed in claim 2, wherein the first control circuit includes n relay signal lines, and activates one of relay signals on the n relay signal lines based on the activated one of the first and second internal data signals, the first control circuit drives one of the first and second output signal lines to the first logic level and drives the other of the first and second output signal lines to the second logic level based on the activated one of the relay signals.

4. The semiconductor device as claimed in claim 3, wherein the output selection circuit includes a first transistor having a first conductivity type and a second transistor having a second conductivity type connected in series between third and fourth power supply lines, and includes a third transistor having the first conductivity type and a fourth transistor having the second conductivity type connected in series between the third and fourth power supply lines, the first and fourth transistor are controlled based on an associated one of the relay signals, the second and third transistor are controlled based on an associated another one of the relay signals, the first output signal line is connected between the first and second transistors, and the second output signal line is connected between the third and fourth transistors.

5. The semiconductor device as claimed in claim 3, wherein a plurality of the output selection circuits are provided, the first output signal line being connected in common to the output selection circuits, and the second output signal line being connected in common to the output selection circuits.

6. The semiconductor device as claimed in claim 1, wherein the first control circuit further receives first and second error detection signals complementary to each other, and outputs third and fourth error detection signals complementary to each other to the first and the second output signal lines after outputting the third and the fourth internal data signals, and the first and second buffer circuits are also controlled based on the third and fourth error detection signals such that one of the first and second buffer circuits turns on and the other of the first and second buffer circuits turns off.

7. The semiconductor device as claimed in claim 1, further comprising a level shifter to generate fifth and sixth internal data signals complementary to each other by changing amplitude values of the third and fourth internal data signals, wherein the first and second buffer circuits are supplied with the fifth and sixth internal data signals.

8. The semiconductor device as claimed in claim 7, further comprising a second control circuit that generates a selection signal, wherein the first and second buffer circuits are also controlled based on the selection signal.

9. The semiconductor device as claimed in claim 8, wherein each of the first and second buffer circuits includes a plurality of unit buffer circuits connected in parallel, and the selection signal indicates a number of the unit buffer circuits to be turned on.

10. The semiconductor device as claimed in claim 9, further comprising a fourth control circuit synthesizing the fifth and sixth internal data signals and the selection signal, wherein the first and the second buffer circuits are controlled based on an output signal of the fourth control circuit.

11. The semiconductor device as claimed in claim 1, wherein the first control circuit controls a logic level of the third and fourth internal data signals such that the first buffer circuit turns on and the second buffer circuit turns off during a period before an output start timing when output of a data signal from the data terminal is started, and controls the logic level of the third and fourth internal data signals such that one of the first and second buffer circuits turns on and the other of the first and second buffer circuits turns off based on a logic level of the data signal to be outputted from the data terminal during a period after the output start timing.

12. A semiconductor device comprising:
a data terminal;
a first power supply line supplying a first potential;
a second power supply line supplying a second potential different from the first potential;
a first buffer circuit coupled between a first power supply line and the data terminal, the first buffer circuit being activated when a first signal is in a first logic level, and deactivated when the first signal is in a second logic level;
a second buffer circuit coupled between a second power supply line and the data terminal, the second buffer circuit being activated when a second signal is in the second logic level, and deactivated when the second signal is in the first logic level, the first and second signals being complementary to each other;
a first output selection circuit including first and second transistors connected in series and third and fourth transistors connected in series, the first signal being outputted from between the first and second transistors, the second signal being outputted from between the third and fourth transistors, the first and fourth transistor being controlled based on a first relay signal, and the second and third transistor being controlled based on a second relay signal; and a first logic circuit activating the first relay signal when at least one of a plurality of third signals is in the one of the first and second logic levels and when a first enable signal is activated, and activating the second relay signal when at least one of a plurality of fourth signals is in the one of the first and second logic levels and when a second enable signal is activated, the third signals and the fourth signals constituting a plurality of pair of third and fourth signals complementary to each other.

13. The semiconductor device as claimed in claim 12, further comprising:

a second output selection circuit including fifth and sixth transistors connected in series and seventh and eighth transistors connected in series, the first signal being outputted from between the fifth and sixth transistors, the second signal being outputted from between the seventh and eighth transistors, the fifth and eighth transistor being controlled based on a third relay signal, and the sixth and seventh transistor being controlled based on a fourth relay signal; and a second logic circuit activating the third relay signal when at least one of a plurality of fifth signals is in the one of the first and second logic levels and when a third enable signal is activated, and activating the fourth relay signal when at least one of a plurality of sixth signals is in the one of the first and second logic levels and when a fourth enable signal is activated, the fifth signals and the sixth signals constituting a plurality of pair of fifth and sixth signals complementary to each other.

14. The semiconductor device as claimed in claim 13, wherein the first to fourth enable signals are successively activated in a predetermined order.

15. The semiconductor device as claimed in claim 14, wherein the first logic circuit deactivates the first and second relay signals when a first clock signal is deactivated, and the second logic circuit deactivates the third and fourth relay signals when a second clock signal is deactivated, the first and second clock signals being complementary to each other.

16. The semiconductor device as claimed in claim 12, wherein the first and third transistors are a first conductivity type and the second and fourth transistors are a second conductivity type opposite to the first conductivity type.

* * * * *